(12) United States Patent
Hosoda et al.

(10) Patent No.: US 10,141,186 B2
(45) Date of Patent: Nov. 27, 2018

(54) TARGET IMAGE-CAPTURE DEVICE, EXTREME-ULTRAVIOLET-LIGHT GENERATION DEVICE, AND EXTREME-ULTRAVIOLET-LIGHT GENERATION SYSTEM

(71) Applicant: Gigaphoton Inc., Tochigi (JP)

(72) Inventors: Hirokazu Hosoda, Oyama (JP); Takayuki Yabu, Oyama (JP); Hideo Hoshino, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/671,691

(22) Filed: Aug. 8, 2017

(65) Prior Publication Data

US 2017/0358442 A1 Dec. 14, 2017

Related U.S. Application Data

(63) Continuation of application No. PCT/JP2016/056804, filed on Mar. 4, 2016.

(30) Foreign Application Priority Data

Mar. 13, 2015 (WO) .................. PCT/JP2015/057502

(51) Int. Cl.
*G03B 27/52* (2006.01)
*H01L 21/027* (2006.01)
(Continued)

(52) U.S. Cl.
CPC ........ *H01L 21/027* (2013.01); *G03F 7/70558* (2013.01); *H05G 2/00* (2013.01)

(58) Field of Classification Search
CPC ........ H05G 2/003; H05G 2/005; H05G 2/008; G03F 7/70558
(Continued)

(56) References Cited

U.S. PATENT DOCUMENTS 9,318,864 B2 * 4/2016 Nowak ................. H01S 3/2316
2014/0253716 A1 9/2014 Saito et al.
(Continued)

FOREIGN PATENT DOCUMENTS

JP 2007-109451 A 4/2007
JP 2007-528607 A 10/2007
(Continued)

OTHER PUBLICATIONS

International Search Report issued in PCT/JP2016-056804; dated May 24, 2016.
(Continued)

*Primary Examiner* — Hung Henry Nguyen
(74) *Attorney, Agent, or Firm* — Studebaker & Brackett PC

(57) ABSTRACT

A target image-capture device may be configured to capture an image of a target that is made into plasma when irradiated with laser light and generates extreme-ultraviolet-light. The target image-capture device may include a droplet detector configured to detect passage of a droplet output as the target, and output a detection signal, an illumination light source, an image capturing element, a shutter device, and a controller configured to output, to the image capturing element, an exposure signal allowing the image capturing element to perform image capturing, and output, to the shutter device, a shutter open/close signal allowing a shutter to perform an open and close operation upon input of the detection signal. The controller may output the shutter open/close signal to the shutter device to make the shutter closed during when the droplet is irradiated with the laser light so that the plasma is generated.

19 Claims, 23 Drawing Sheets

(51) Int. Cl.
*G03F 7/20* (2006.01)
*H05G 2/00* (2006.01)

(58) Field of Classification Search
USPC .................................. 355/68–69; 250/504 R
See application file for complete search history.

(56) References Cited

U.S. PATENT DOCUMENTS

2016/0037616 A1* 2/2016 Saito ...................... H05G 2/005
 250/504 R
2016/0234920 A1 8/2016 Suzuki et al.

FOREIGN PATENT DOCUMENTS

| JP | 2014-175474 A | 9/2014 |
| WO | 2005/091879 A2 | 10/2005 |
| WO | 2014/189055 A1 | 11/2014 |
| WO | 2015/041260 A1 | 3/2015 |

OTHER PUBLICATIONS

International Preliminary Report on Patentability and Written Opinion of the International Searching Authority issued in PCT/JP2016-056804; dated Sep. 19, 2017.

* cited by examiner

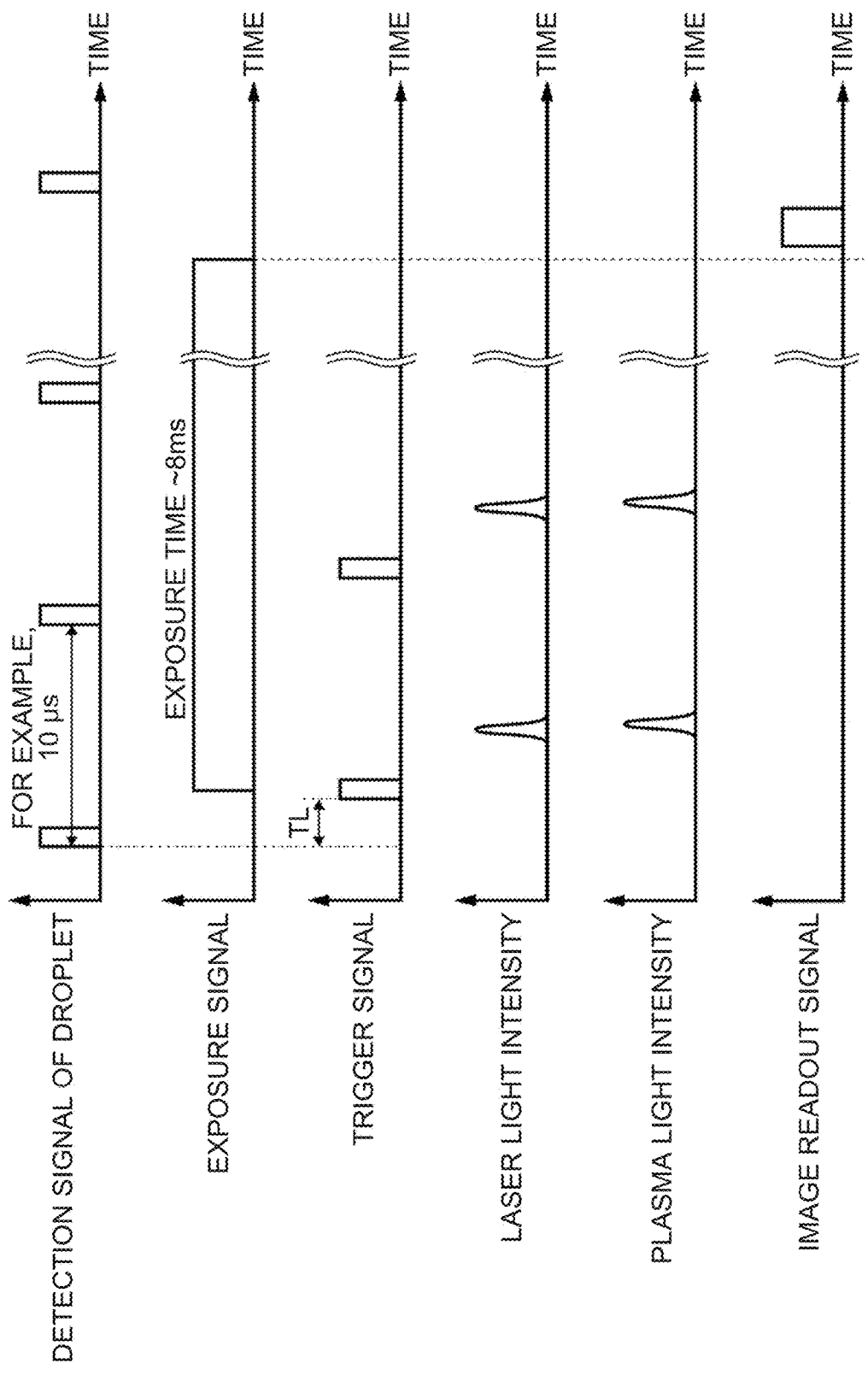

MULTIPLE EXPOSURE IMAGE OF TARGET

MULTIPLE EXPOSURE IMAGE OF TARGET

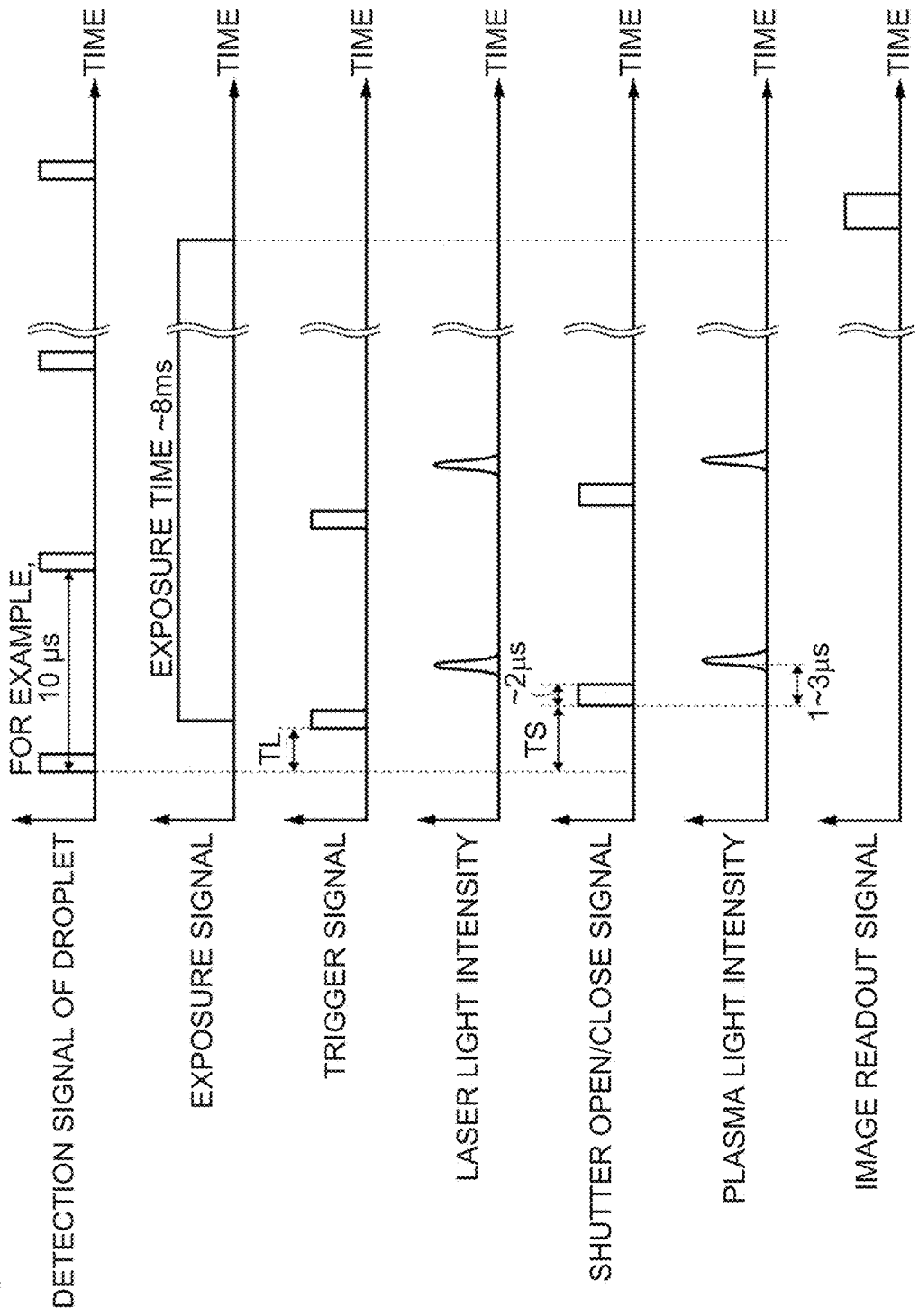

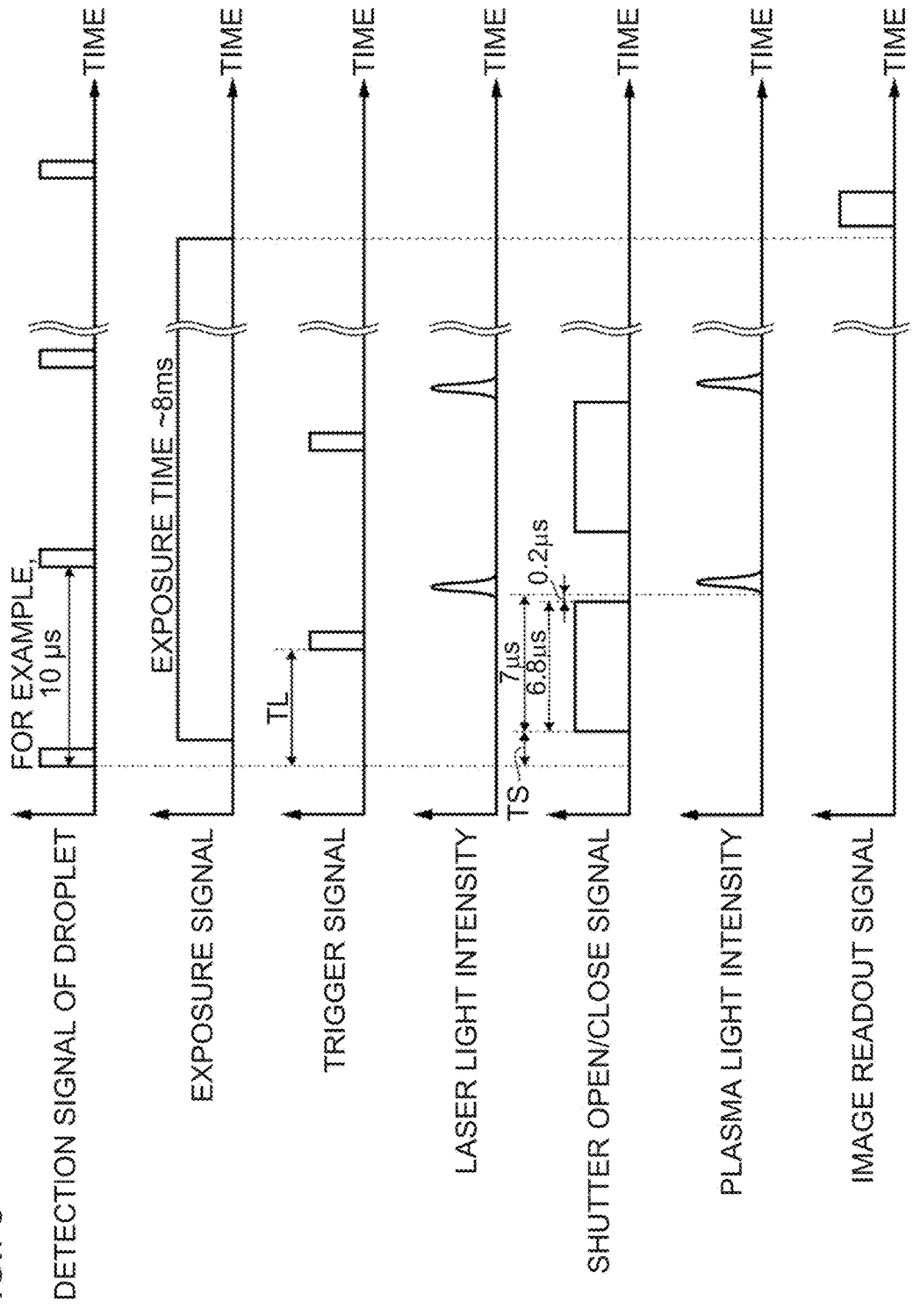

TARGET IMAGE-CAPTURE DEVICE, EXTREME-ULTRAVIOLET-LIGHT GENERATION DEVICE, AND EXTREME-ULTRAVIOLET-LIGHT GENERATION SYSTEM

CROSS-REFERENCE TO RELATED APPLICATIONS

The present application is a continuation application of international Application No. PCT/JP2016/056804 filed on Mar. 4, 2016 claiming priority to International Application No. PCT/JP2015/057502 filed on Mar. 13, 2015. Each of the above applications is incorporated herein by reference in its entirety.

BACKGROUND

1. Technical Field

The present disclosure relates to a device and a system for generating extreme ultraviolet (EUV) light.

2. Related Art

In Recent years, along with miniaturization of a semiconductor process, miniaturization of a transfer pattern in photolithography of a semiconductor process has been developed rapidly. In the next generation, fine processing of 70 nm to 45 nm, moreover, fine processing of 32 nm or less will be demanded. In order to respond to a demand for fine processing of 32 nm or less, for example, it is expected to develop an exposure device in which an extreme ultraviolet (EUV) light generation device configured to generate extreme ultraviolet (EUV) light having a wavelength of about 13 nm and reduced projection reflective optics are combined.

As EUV light generation devices, three types of devices are proposed, namely an LPP (Laser Produced Plasma) type device using plasma generated by radiating laser light to a target, a DPP (Discharge Produced Plasma) type device using plasma generated by electric discharge, and an SR (Synchrotron Radiation) type device using orbital radiation light.

CITATION LIST

Patent Literature

Patent Literature 1: Japanese National Publication of International Patent Application No. 2007-528607
Patent Literature 2: Japanese Patent Application Laid-Open No. 2014-175474
Patent Literature 3: International Publication No. WO 2015/041260 A1

SUMMARY

A target image-capture device according to one aspect of the present disclosure may be configured to capture an image of a target that is made into plasma when irradiated with laser light and generates extreme-ultraviolet-light. The target image-capture device may include a droplet detector, an illumination light source, an image capturing element, a shutter device, and a controller. The droplet detector may be configured to detect passage of a droplet output, as the target, from a target supply unit to a predetermined region in which the extreme-ultraviolet-light is generated, and output a detection signal each time the passage of the droplet is detected. The illumination light source may be configured to radiate illumination light to the droplet detected by the droplet detector. The image capturing element may be configured to receive reflected light from the droplet, the reflected light being caused by the droplet being irradiated with the illumination light, and capture an image of the droplet. The shutter device may include a shutter. The shutter may be configured to switch between propagation and cutoff of light including the reflected light to the image capturing element. The controller may be configured to output, to the image capturing element, an exposure signal allowing the image capturing element to perform image capturing, and output, to the shutter device, a shutter open/close signal allowing the shutter to perform an open and close operation upon input of the detection signal, to thereby allow the reflected light to be exposed to the image capturing element. The controller may output the shutter open/close signal to the shutter device to make the shutter closed during when the droplet is irradiated with the laser light in the predetermined region so that the plasma is generated.

An extreme-ultraviolet-light generation device according to one aspect of the present disclosure may include a chamber, a target supply unit, a target stage, a droplet detector, an illumination light source, an image capturing element, a shutter device, and a controller. In the chamber, a target supplied to a plasma generation region may be made into plasma by being irradiated with laser light, and extreme-ultraviolet-light may be generated. The target supply unit may be configured to output the target as a droplet into the chamber to thereby supply the target to the plasma generation region. The target stage may be configured to move the target supply unit to a direction substantially perpendicular to a trajectory of the droplet output from the target supply unit. The droplet detector may be configured to detect passage of the droplet between the target supply unit and the plasma generation region, and output a detection signal each time the passage of the droplet is detected. The illumination light source may be configured to radiate illumination light to the droplet detected by the droplet detector. The image capturing element may be configured to receive reflected light from the droplet, the reflected light being caused by the droplet being irradiated with the illumination light, and capture an image of the droplet. The shutter device may include a shutter. The shutter may be configured to switch between propagation and cutoff of light including the reflected light to the image capturing element. The controller may be configured to output, to the image capturing element, an exposure signal allowing the image capturing element to perform image capturing, and output, to the shutter device, a shutter open/close signal allowing the shutter to perform an open and close operation upon input of the detection signal, to thereby allow the reflected light to be exposed to the image capturing element, and the controller may be configured to control the target stage based on an image that is provided by the exposure and output from the image capturing element. The controller may output the shutter open/close signal to the shutter device to make the shutter closed during when the droplet is irradiated with the laser light in the plasma generation region so that the plasma is generated.

An extreme-ultraviolet-light generation system according to one aspect of the present disclosure may include a chamber, a laser device, a target supply unit, a target stage, a droplet detector, an illumination light source, an image capturing element, a shutter device, and a controller. In the chamber, a target supplied to a plasma generation region may be made into plasma by being irradiated with laser light so that extreme-ultraviolet-light may be generated. The laser device may be configured to output the laser light. The target supply unit may be configured to supply the target as a droplet to the plasma generation region. The target stage may be configured to move the target supply unit to a direction substantially perpendicular to a trajectory of the droplet output from the target supply unit. The droplet detector may be configured to detect passage of the droplet between the target supply unit and the plasma generation region, and output a detection signal each time the passage of the droplet is detected. The illumination light source may be configured to radiate illumination light to the droplet detected by the droplet detector. The image capturing element may be configured to receive reflected light from the droplet, the reflected light being caused by the droplet being irradiated with the illumination light, and capture an image of the droplet. The shutter device may include a shutter. The shutter may be configured to switch between propagation and cutoff of light including the reflected light to the image capturing element. The controller may be configured to output a trigger signal allowing the laser device to output the laser light based on input of the detection signal, output, to the image capturing element, an exposure signal allowing the image capturing element to perform image capturing, and output, to the shutter device, a shutter open/close signal allowing the shutter to perform an open and close operation based on input of the trigger signal, to thereby allow the reflected light to be exposed to the image capturing element, and move the target stage based on an image that is provided by exposing the reflected light to the image capturing element and output from the image capturing element. The controller may output the shutter open/close signal to the shutter device to make the shutter closed during when the droplet is irradiated with the laser light in the plasma generation region so that the plasma is generated.

BRIEF DESCRIPTION OF THE DRAWINGS

Some embodiments of the present disclosure will be described below as just examples with reference to the accompanying drawings.

FIG. 4A illustrates a time chart according to droplet image acquisition in a controller illustrated in FIG. 2;

FIG. 7A is a time chart regarding acquisition of an image of a droplet in a controller of the EUV light generation device of the first embodiment;

FIG. 7C illustrates another example of a time chart regarding acquisition of an image of a droplet in the controller of the EUV light generation device of the first embodiment;

EMBODIMENTS

Figure 1:
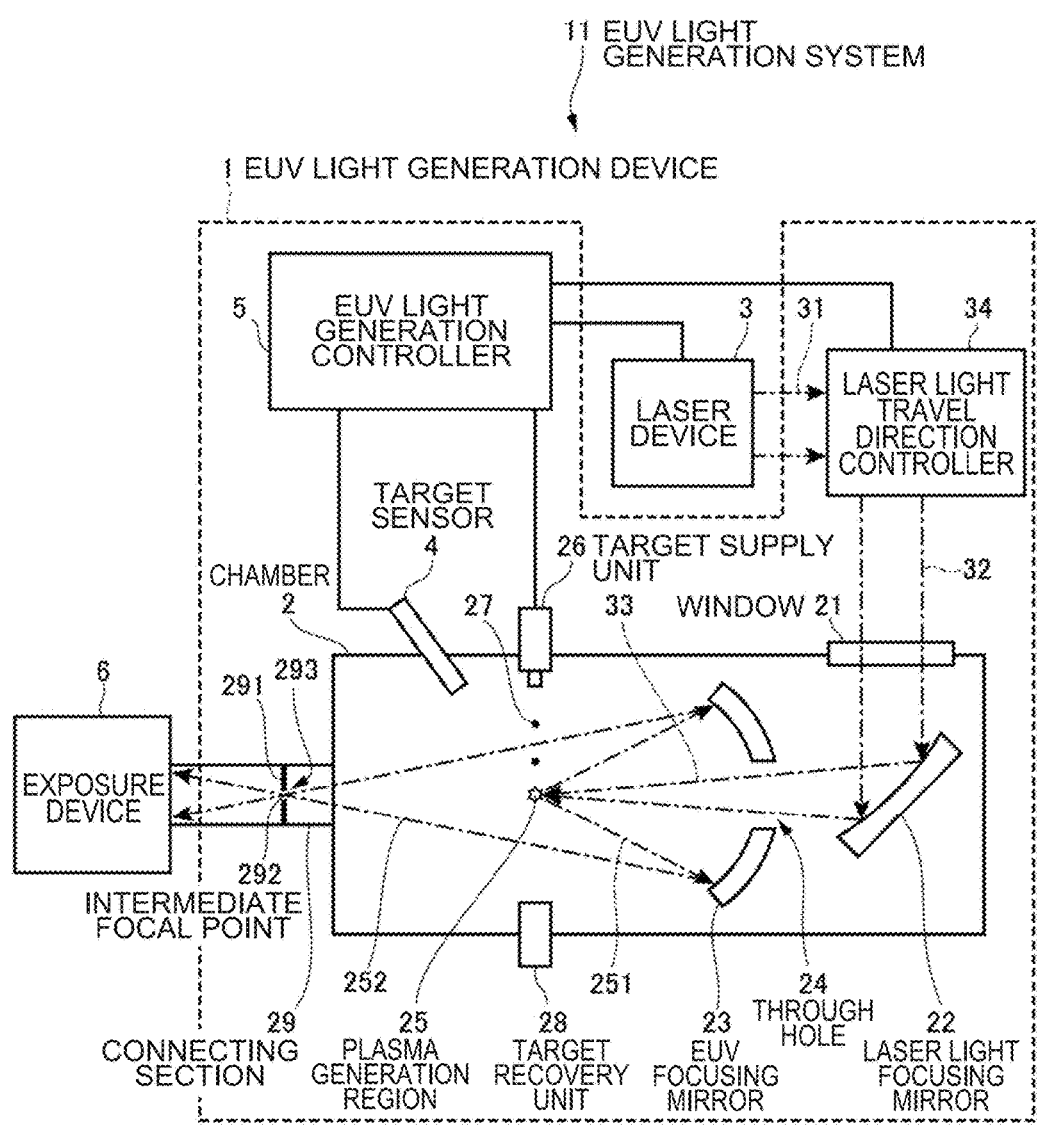
FIG. 1 schematically illustrates a configuration of an exemplary LPP type EUV light generation system.

Contents
1. Overview
2. Terms

3. Overall description of EUV light generation system
3.1 Configuration
3.2 Operation
4. EUV light generation device provided with target image-capture device
4.1 Configuration: Overall
4.2 Configuration: Droplet detector
4.3 Configuration: Trajectory image capturing unit
4.4 Operation
4.5 Effect
5. Problem
6. Trajectory image capturing unit provided to EUV light generation device of first embodiment
6.1 Configuration
6.2 Operation
6.3 Effect
7. Trajectory image capturing unit provided to EUV light generation device of modification 1 of first embodiment
7.1 Configuration
7.2 Effect
8. Trajectory image capturing unit provided to EUV light generation device of modification 2 of first embodiment
8.1 Configuration
8.2 Effect
9. Trajectory image capturing unit provided to EUV light generation device of modification 3 of first embodiment
9.1 Configuration
9.2 Effect
10. Trajectory image capturing unit provided to EUV light generation device of second embodiment
10.1 Configuration
10.2 Operation
10.3 Effect
11. Trajectory image capturing unit provided to EU light generation device of third embodiment
11.1 Configuration
11.2 Effect
12. Shutter device
12.1 Image intensifier unit
12.2 PLZT polarizing shutter
13. Trajectory image capturing unit provided to EUV light generation device of fourth embodiment
13.1 Configuration
13.2 Operation
13.3 Effect
14. Hardware environment of each controller Hereinafter, embodiments of the present disclosure will be described in detail with reference to the drawings. The embodiments described below illustrate some examples of the present disclosure, and do not limit the contents of the present disclosure. All of the configurations and the operations described in the embodiments are not always indispensable as configurations and operations of the present disclosure. It should be noted that the same constituent elements are denoted by the same reference signs, and overlapping description is omitted.

1. Overview

The present disclosure may at least disclose embodiments described below as mere examples.

A target image-capture device 40 according to the present disclosure may include a droplet detector 41 configured to detect passage of a droplet 271 output from a target supply unit 26 as a target 27 to a predetermined region where extreme ultraviolet light is generated, and output a detection signal each time the passage of the droplet 271 is detected, an illumination light source 421a configured to radiate illumination light to the droplet 271 detected by the droplet detector 41, an image capturing element 422a configured to capture an image of the droplet 271 by receiving, from the droplet 271, reflected light generated by radiation of the illumination light, a shutter device 422d including a shutter configured to switch between propagation and cutoff of light including the reflected light to the image capturing element 422a, and a controller 8A configured to output an exposure signal for allowing image capturing to the image capturing element 422a, and output a shutter open/close signal for allowing the shutter to perform open and close operation when a detection signal is input during when the exposure signal is output, to thereby perform multiple exposure of the reflected light from the droplets 271 to the image capturing element 422a.

Accordingly, the target image-capture device 40 of the present disclosure can acquire an image of the droplet 271 not including plasma light, while performing multiple exposure of images of different droplets 271 in a vicinity of a plasma generation position.

Therefore, the controller 8A can improve the accuracy of trajectory control of the droplet 271 based on the image acquired by the image capturing element 422a.

2. Terms

"Target" is an object irradiated with laser light introduced in the chamber. The target irradiated with laser light is made into plasma and radiates EUV light.

"Droplet" is a mode of a target supplied to an inside of the chamber.

"Plasma light" is radiated light radiated from the target that was made into plasma. The radiated light includes EUV light.

3. Overall Description of EUV Light Generation System

[3.1 Configuration]

FIG. 1 schematically illustrates a configuration of an exemplary LPP type EUV light generation system.

An EUV light generation device 1 may be used together with at least one laser device 3. In the present application, a system including the EUV light generation device 1 and the laser device 3 is called an EUV light generation system 11. As illustrated in FIG. 1 and as described below in detail, the EUV light generation device 1 may include a chamber 2 and a target supply unit 26. The chamber 2 may be sealable. The target supply unit 26 may be provided so as to penetrate a wall of the chamber 2. A material of a target substance supplied from the target supply unit 26 may include, but not limited to, tin, terbium, gadolinium, lithium, xenon, or a combination of any two or more of them.

A wall of the chamber 2 may be provided with at least one through hole. The through hole may be provided with a window 21, and pulse laser light 32 output from the laser device 3 may penetrate the window 21. Inside the chamber 2, an EUV focusing mirror 23 having a spheroidal reflection surface, for example, may be disposed. The EUV focusing mirror 23 may have first and second focal points. On a surface of the EUV focusing mirror 23, a multilayer reflection film in which molybdenum and silicon are alternately layered, for example, may be formed. It is preferable that the EUV focusing mirror 23 is disposed such that the first focal point locates in a plasma generation region 25 and the second focal point locates at an intermediate focal point (IF)

292, for example. The EUV focusing mirror 23 may have a through hole 24 in a center portion thereof, and pulse laser light 33 may pass through the through hole 24.

The EUV light generation device 1 may include an EUV light generation controller 5, a target sensor 4, and the like. The target sensor 4 may have an image capturing function, and may be configured to detect presence, trajectory, position, velocity, and the like of the target 27.

The EUV light generation device 1 may also include a connecting section 29 configured to communicate the inside of the chamber 2 and an inside of an exposure device 6 with each other. In the connecting section 29, a wall 291 having an aperture 293 may be provided. The wall 291 may be disposed such that the aperture 293 locates at a second focal point position of the EUV focusing mirror 23.

Moreover, the EUV light generation device 1 may include a laser light travel direction controller 34, a laser light focusing mirror 22, a target recovery unit 28 configured to recover the target 27, and the like. The laser light travel direction controller 34 may have an optical element configured to define a travel direction of the laser light, and an actuator configured to adjust a position, posture, and the like of the optical element.

[3.2 Operation]

Referring to FIG. 1, the pulse laser light 31 output from the laser device 3 may pass through the laser light travel direction controller 34 and penetrate the window 21 as pulse laser light 32 to enter the chamber 2. The pulse laser light 32 may travel inside the chamber 2 along at least one laser light path, and may be reflected at the laser light focusing mirror 22 and radiated as the pulse laser light 33 to at least one target 27.

The target supply unit 26 may be configured to output the target 27 toward the plasma generation region 25 in the chamber 2. The target 27 may be irradiated with at least one pulse included in the pulse laser light 33. The target 27 irradiated with the pulse laser light is made into plasma, and from the plasma, EUV light 251 may be radiated along with radiation of light having a wavelength different from that of the EUV light 251. The EUV light 251 may be reflected selectively by the EUV focusing mirror 23. EUV light 252 reflected by the EUV focusing mirror 23 may be condensed at the intermediate focal point 292 and output to the exposure device 6. One target 27 may be irradiated with a plurality of pulses included in the pulse laser light 33.

The EUV light generation controller 5 may be configured to integrate control of the entire EUV light generation system 11. The EUV light generation controller 5 may be configured to process image data or the like of the target 27 captured by the target sensor 4. Further, the EUV light generation controller 5 may perform at least one of control of timing when the target 27 is output and control of the target 27 output direction or the like, for example. Furthermore, the EUV light generation controller 5 may perform at least one of control of an output timing of the laser device 3, control of a travel direction of the pulse laser light 32, and control of a light condensing position of the pulse laser light 33, for example. The various types of control described above are merely examples, and another control can be added when necessary.

4. EUV Light Generation Device Provided with Target Image-Capture Device

[4.1. Configuration: Overall]

A configuration of the EUV light generation device 1 including the target image-capture device 40 will be described with reference to FIG. 2.

Figure 2:
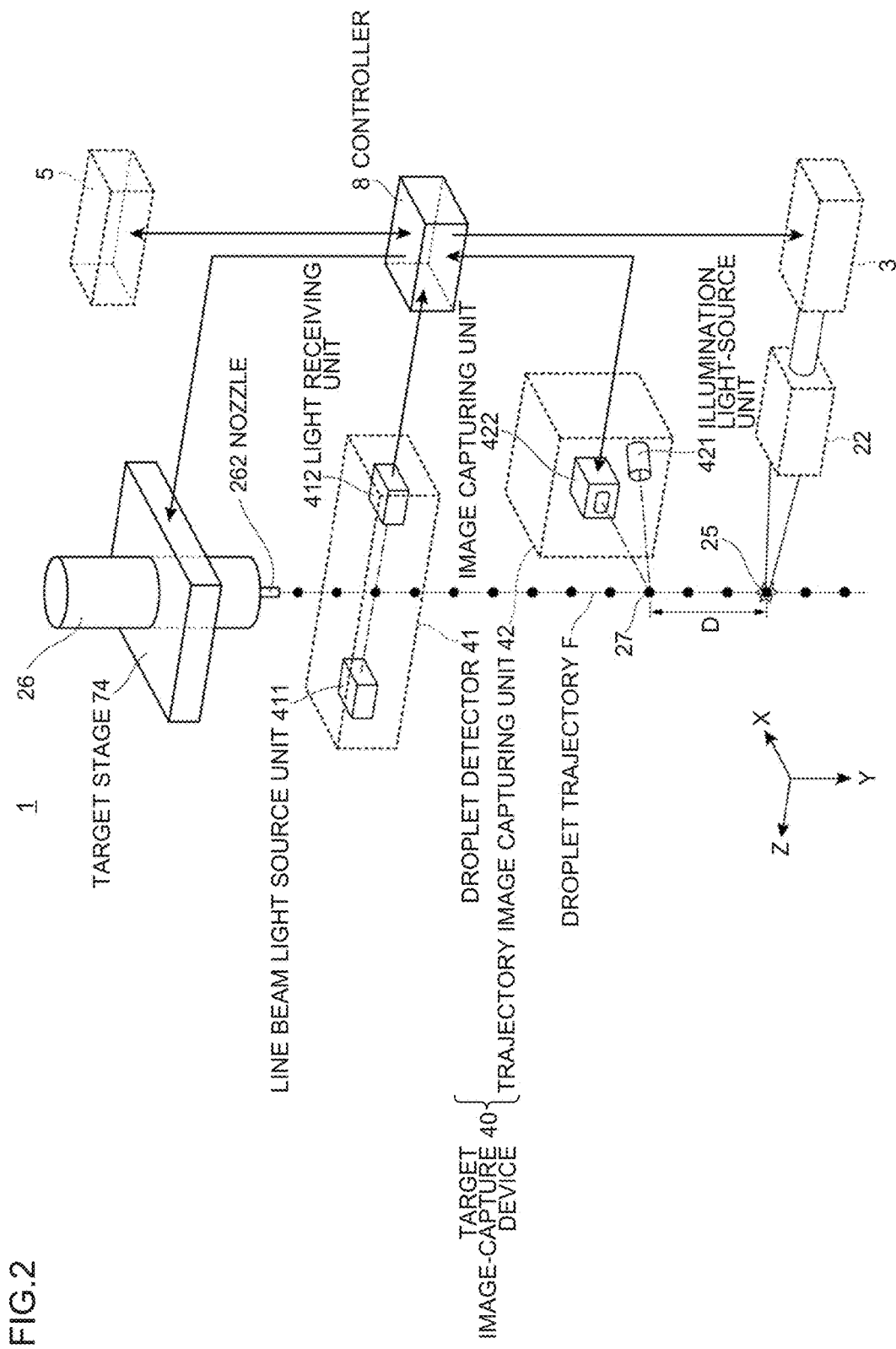
FIG. 2 illustrates a part of a configuration of an EUV light generation device including a target image-capture device.

FIG. 2 illustrates a configuration of the target supply unit 26 and the target image-capture device 40 corresponding to a target sensor 4, in the EUV light generation device 1 illustrated in FIG. 1. It should be noted that the chamber 2 is not illustrated in FIG. 2.

As illustrated in FIG. 2, the target supply unit 26 may be mounted on a target stage 74.

The target stage 74 may be a two-axis stage configured to move the target supply unit 26 relative to the chamber 2. The target stage 74 may be a stage configured to move the target supply unit 26 in an X axis direction and Z axis direction, for example.

The target supply unit 26 may be configured to output the target 27 in a droplet state to the plasma generation region 25 via a nozzle 262. The moving path of the target 27 moving from the nozzle 262 to the plasma generation region 25 may be a droplet trajectory F.

The target image-capture device 40 may include a droplet detector 41, a trajectory image capturing unit 42, and a controller 8. The droplet detector 41 and the trajectory image capturing unit 42 may be disposed in the chamber 2.

The droplet detector 41 may be disposed on the droplet trajectory F. The droplet detector 41 may be disposed on the downstream side in the moving direction of the target 27 with respect to the nozzle 262.

The trajectory image capturing unit 42 may be disposed between the droplet detector 41 and the plasma generation region 25. The trajectory image capturing unit 42 may be disposed on the droplet trajectory F so as to capture an image of the target 27 passing through the region on the upstream side in the moving direction of the target 27 with respect to the plasma generation region 25. For example, the image capturing region captured by the trajectory image capturing unit 42 may be a region away from the plasma generation region 25 by 17 mm to the target supply unit 26 side.

The trajectory image capturing unit 42 may be disposed to capture an image of the target 27 from a direction substantially orthogonal to the droplet trajectory F, such as the X axis direction in the drawing, for example.

The controller 8 may be connected with the droplet detector 41, the trajectory image capturing unit 42, the target stage 74, an EUV light generation controller 5, and the laser device 3.

[4.2 Configuration: Droplet Detector]

A configuration of the droplet detector 41 will be described with reference to FIG. 3A.

The droplet detector 41 may include a line beam light source unit 411 and a light receiving unit 412.

The line beam light source unit 411 and the light receiving unit 412 may be disposed opposite to each other with the droplet trajectory F of the droplet 271, that is, a form of the target 27 being interposed between them. The line beam light source unit 411 and the light receiving unit 412 may be provided via the windows 411c and 412c disposed on the chamber wall 2a, respectively.

The line beam light source unit 411 may be configured to output a line beam.

The line beam light source unit 411 may be disposed such that an output line beam crosses the target trajectory F.

The line beam light source unit 411 may include a light source 411a such as a CW laser (continuous wave laser), a high intensity lamp, and an LED (light emitting diode), and a line beam optical system 411b including a cylindrical lens or the like.

The light receiving unit 412 may be disposed such that a line beam output from the line beam light source unit 411 is made incident while passing through the target trajectory F.

The light receiving unit 412 may include a light receiving optical system 412h and a light receiving element 412a including a line sensor such as a photodiode array.

The light receiving element 412a may be connected with the controller 8. The light receiving element 412a may receive a line beam output from the line beam light source unit 411 via the light receiving optical system 412b.

[4.3 Configuration: Trajectory Image Capturing Unit]

A configuration of the trajectory image capturing unit 42 will be described with reference to FIGS. 3B and 3C.

Figure 3A:
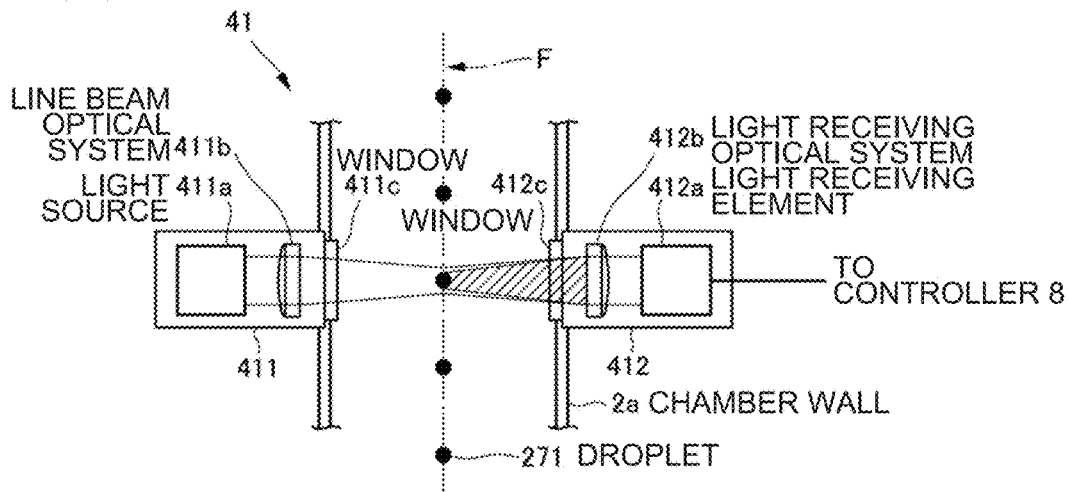
FIG. 3A is a drawing for explaining a configuration of a droplet detector provided to the EUV light generation device illustrated in FIG. 2.
Figure 3B:
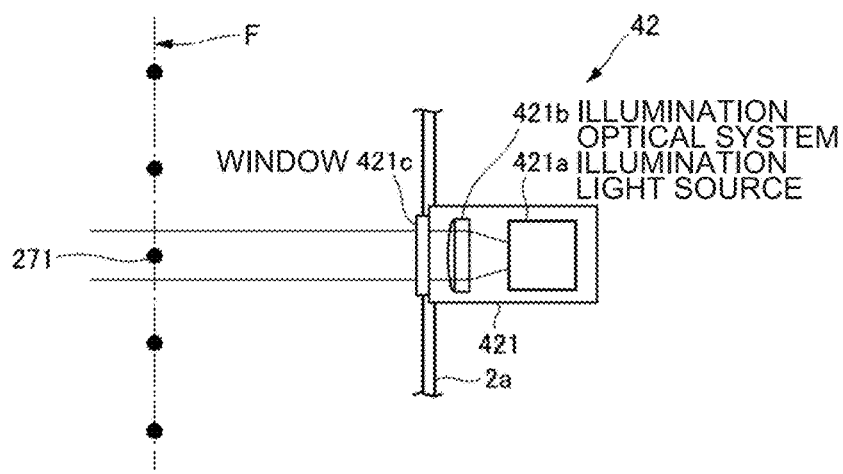
FIG. 3B is a drawing for explaining a configuration of an illumination light-source unit of a trajectory image capturing unit provided to the EUV light generation device illustrated in FIG. 2.
Figure 3C:
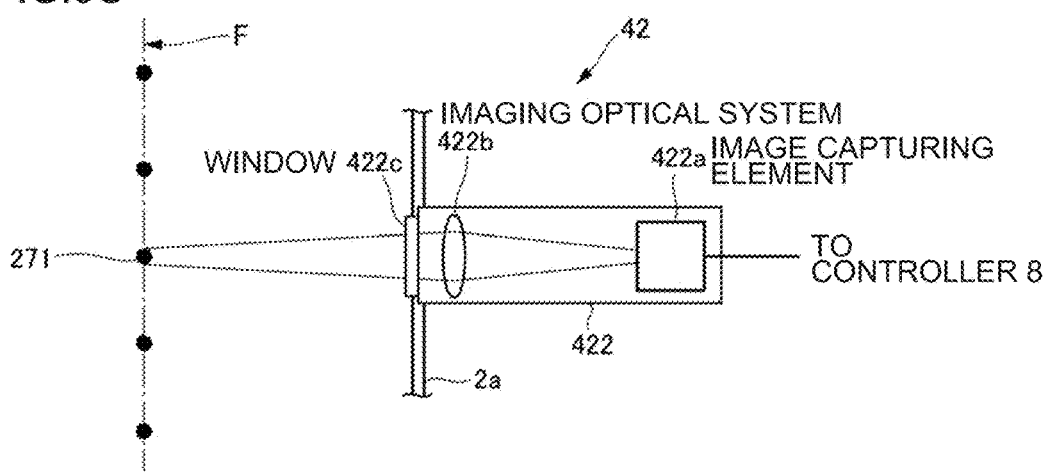
FIG. 3C is a drawing for explaining a configuration of an image capturing unit of the trajectory image capturing unit provided to the EUV light generation device illustrated in FIG. 2.

The trajectory image capturing unit 42 may include an illumination light-source unit 421 illustrated in FIG. 3B and the image capturing unit 422 illustrated in FIG. 3C.

The illumination light-source unit 421 may be configured to irradiate the droplet 271 with illumination light via a window 421c disposed on the chamber wall 2a, as illustrated in FIG. 3B.

The illumination light-source unit 421 may include an illumination light source 421a and an illumination optical system 421b. The illumination light source 421a may be laser light source, LED, or the like.

The image capturing unit 422 may be disposed such that reflected light, reflected by the droplet 271, of the illumination light from the illumination light-source unit 421 is made incident via a window 422c disposed on the chamber wall 2a, as illustrated in FIG. 3C. The image capturing unit 422 may include an image capturing element 422a and an imaging optical system 422b.

The image capturing element 422a may include a CCD (charge coupled device) or the like capable of capturing a two-dimensional image. The image capturing element 422a may be connected with the controller 8.

[4.4 Operation]

A control performed by the controller 8 will be described with reference to FIGS. 4A and 4B.

Figure 4B:
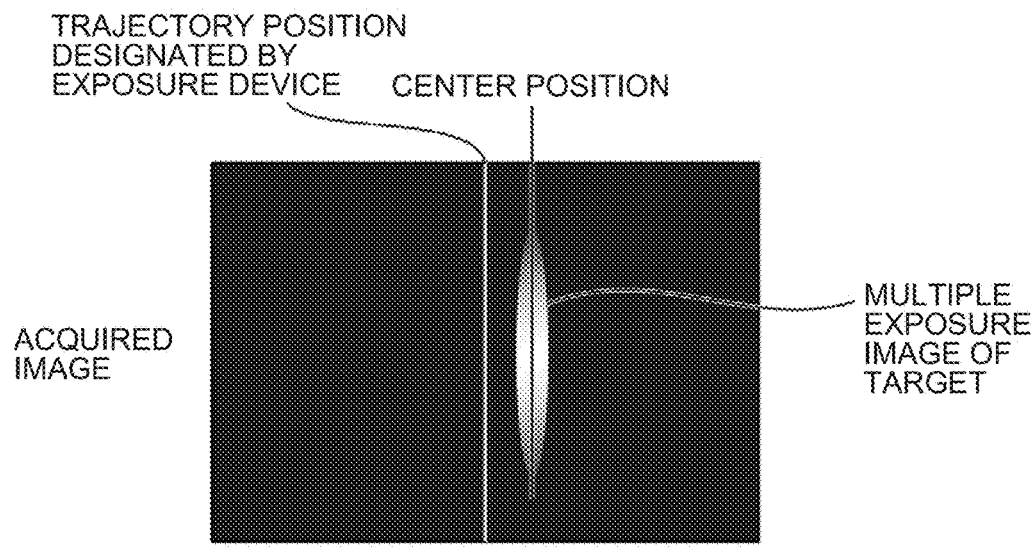
FIG. 4B illustrates an exemplary image of a droplet captured by the image capturing unit of the trajectory image capturing unit illustrated in FIG. 2.

In the description of FIGS. 4A and 4B, the content described with reference to FIG. 2 and FIGS. 3A to 3C is omitted.

FIG. 4A is a time chart regarding control performed by the controller 8 illustrated in FIG. 2, illustrating the case of performing image measurement of the droplet 271 before the droplet 271 reaches the plasma generation region 25.

First, the EUV light generation controller 5 may output the droplet 271 from the target supply unit 26 to the plasma generation region 25.

Then, the droplet 271 may pass through a line beam output from the line beam light source unit 411.

It should be noted that the target supply unit 26 may output the droplets 271 at 10 μs intervals, for example.

When the droplet 271 passes through a line beam output from the line beam light source unit 411 as illustrated in FIG. 3A, the light receiving unit 412 may output a detection signal corresponding to detection of the droplet 271 as illustrated in FIG. 4A.

When a detection signal output from the light receiving unit 412 is input, the controller 8 may output an exposure signal to the image capturing unit 422 of the trajectory image capturing unit 42. Meanwhile, the controller 8 may output an exposure signal to the image capturing unit 422 of the trajectory image capturing unit 42 regardless of presence or absence of an input of a detection signal.

The image capturing unit 422 may start image capturing when an exposure signal is input.

The controller 8 may output a trigger signal for instructing laser oscillation to the laser device 3 at the timing delayed by a predetermined delay time TL from the timing when a detection signal is input as illustrated in FIG. 4A.

It should be noted that the delay time TL may be determined such that laser light output from the laser device 3 is radiated to the droplet 271 when the droplet 271 corresponding to the detection signal reaches the plasma generation region 25.

The laser device 3 may output pulse laser light 31 when a trigger signal is input to the laser device 3.

The pulse laser light 31 may be radiated to the droplet 271 via a laser light travel direction controller 34 and a laser light focusing mirror 22. Thereby, plasma light can be generated.

The controller 8 may stop outputting of an exposure signal after a predetermined time elapses from outputting of an exposure signal, as illustrated in FIG. 4A. Here, a predetermined time from when outputting of an exposure signal is started to the time when outputting of an exposure signal is stopped is determined to be an exposure time.

The exposure time may be a period of several ms. For example, the exposure time may be 8 ms.

The image capturing unit 422 of the trajectory image capturing unit 42 may perform multiple exposure of images of droplets 271 irradiated with illumination light by the illumination light-source unit 421 during the time when exposure signals are input.

The controller 8 may output an image readout signal to the image capturing unit 422 in order to read an image from the image capturing unit 422. The controller 8 may acquire an image output from the image capturing unit 422.

FIG. 4B illustrates an example of an image that can be acquired from the image capturing unit 422 by the controller 8.

The image illustrated in FIG. 4B can be an integrated image of the droplets 271 passing through a round illumination range, for example. Accordingly, in the image, an elliptic or linear trajectory of the droplets 271 can be included.

Figure 4C:
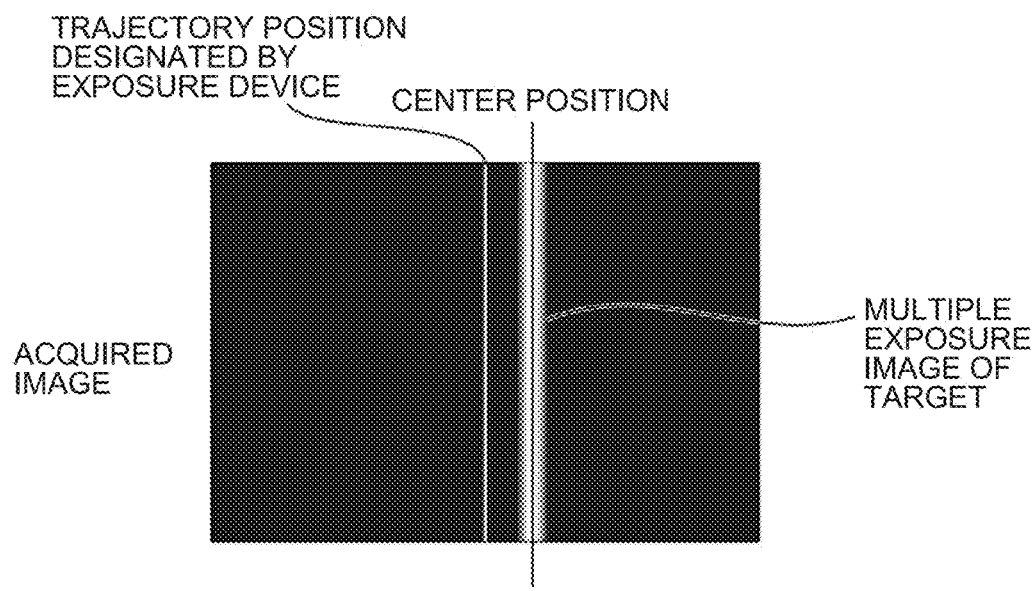
FIG. 4C illustrates another example 1 of an image of a droplet captured by the image capturing unit of the trajectory image capturing unit illustrated in FIG. 2.

When the illumination range by the illumination light-source unit 421 at the trajectory position of the droplet 271 exceeds an angle of view of the image capturing unit 422, the controller 8 can acquire an image including a linear trajectory of the droplets 271 as illustrated in FIG. 4C, for example.

The controller 8 may calculate the trajectory position of the droplet 271 based on an image acquired from the image capturing unit 422. The acquired image can be an image including an ellipse or a line showing the trajectory of the droplet 271 as illustrated in FIGS. 4B and 4C, for example. The controller 8 may calculate a center position of the ellipse or the line on the image coordinate.

The controller 8 may recognize the calculated center position of the trajectory of the droplet 271 as the actual trajectory position of the droplet 271. The controller 8 may move the target stage 74 based on the recognized actual trajectory position such that the droplet 271 passes through a desired plasma generation position.

The controller 8 may calculate the trajectory position according to designation on the image coordinate, as illustrated in FIG. 4B, as a trajectory through which the droplet 271 should pass, based on the position information of the plasma generation position designated by an exposure device 6 via the EUV light generation controller 5 in advance, for example.

The controller 8 may move the target stage 74 based on a difference between the designated trajectory position through which the droplet 271 should pass on the image coordinate, and the actual trajectory position of the droplet 271 acquired.

It should be noted that the plasma generation position designated by the exposure device 6 may be a particular space position in the plasma generation region 25.

It should be noted that in the EUV light generation device 1 illustrated in FIG. 2, the Z direction may correspond to the horizontal direction on the image of FIG. 4B acquired by the image capturing unit 422. Accordingly, in the case of acquiring the image as illustrated in FIG. 4B, the target stage 74 may be moved in the Z direction.

At this time, the amount of movement of the target stage 74 may be determined based on the magnification of the image illustrated in FIG. 4B or the number of difference pixels.

[4.5 Effect]

As described above, by moving the target stage 74 with reference to an image acquired by the trajectory image capturing unit 42, a trajectory of the droplet 271 can be controlled. Accordingly, it is possible to generate plasma stably at a desired plasma generation position designated by the exposure device 6.

5. Problem

In the EUV light generation device 1, in order to enhance the accuracy of the trajectory control of the droplet 271, a request for performing image capturing by the trajectory image capturing unit 42 at the timing when the droplet 271, that is the target of image capturing, moves to a position close to the plasma generation region, can be made.

In the case of capturing an image at such timing, the distance between the droplet 271 to be captured and the plasma generation region 25 may be several tens to several hundreds μm.

In the case where the distance between the droplet 271 and the plasma generation region 25 is close to each other, the image capturing region of the trajectory image capturing unit 42 can include the plasma generation region 25.

Figure 4D:
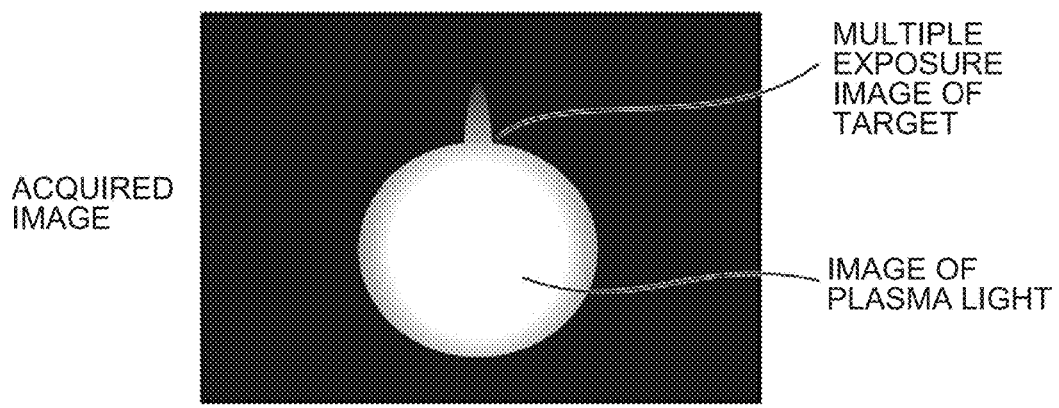
FIG. 4D illustrates another example 2 of an image of a droplet captured by the image capturing unit of the trajectory image capturing unit illustrated in FIG. 2.

Accordingly, as illustrated in FIG. 4D, an image of plasma light can be shown on the image acquired by the trajectory image capturing unit 42.

Figure 4E:
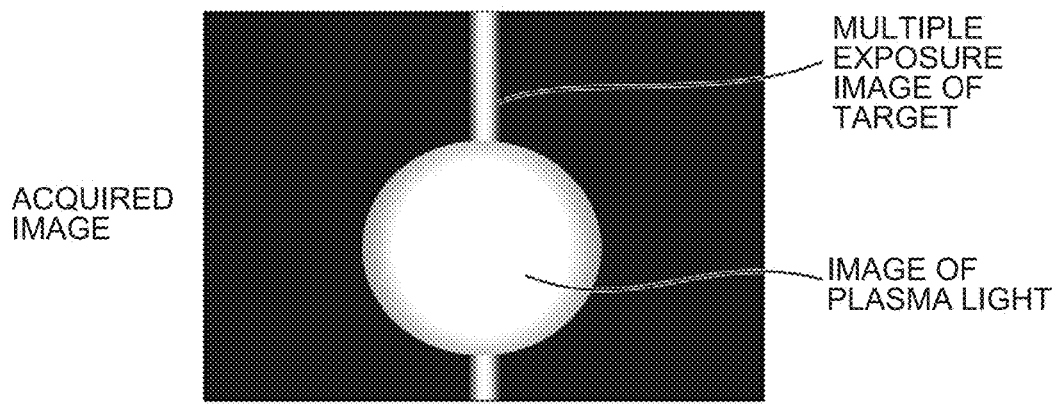
FIG. 4E illustrates another example 3 of an image of a droplet captured by the image capturing unit of the trajectory image capturing unit illustrated in FIG. 2.

Further, in the case where the illumination range by the illumination light-source unit 421 at the trajectory position of the droplet 271 exceeds the angle of view of the image capturing unit 422 as described above, the trajectory image capturing unit 42 can acquire an image as illustrated in FIG. 4E, for example. This means that an image of plasma light can be shown on an image including a linear image of the droplet 271 as illustrated in FIG. 4E.

Therefore, calculation of the actual trajectory position of the droplet 271 can be difficult due to an effect of an image of plasma light.

Figure 5A:
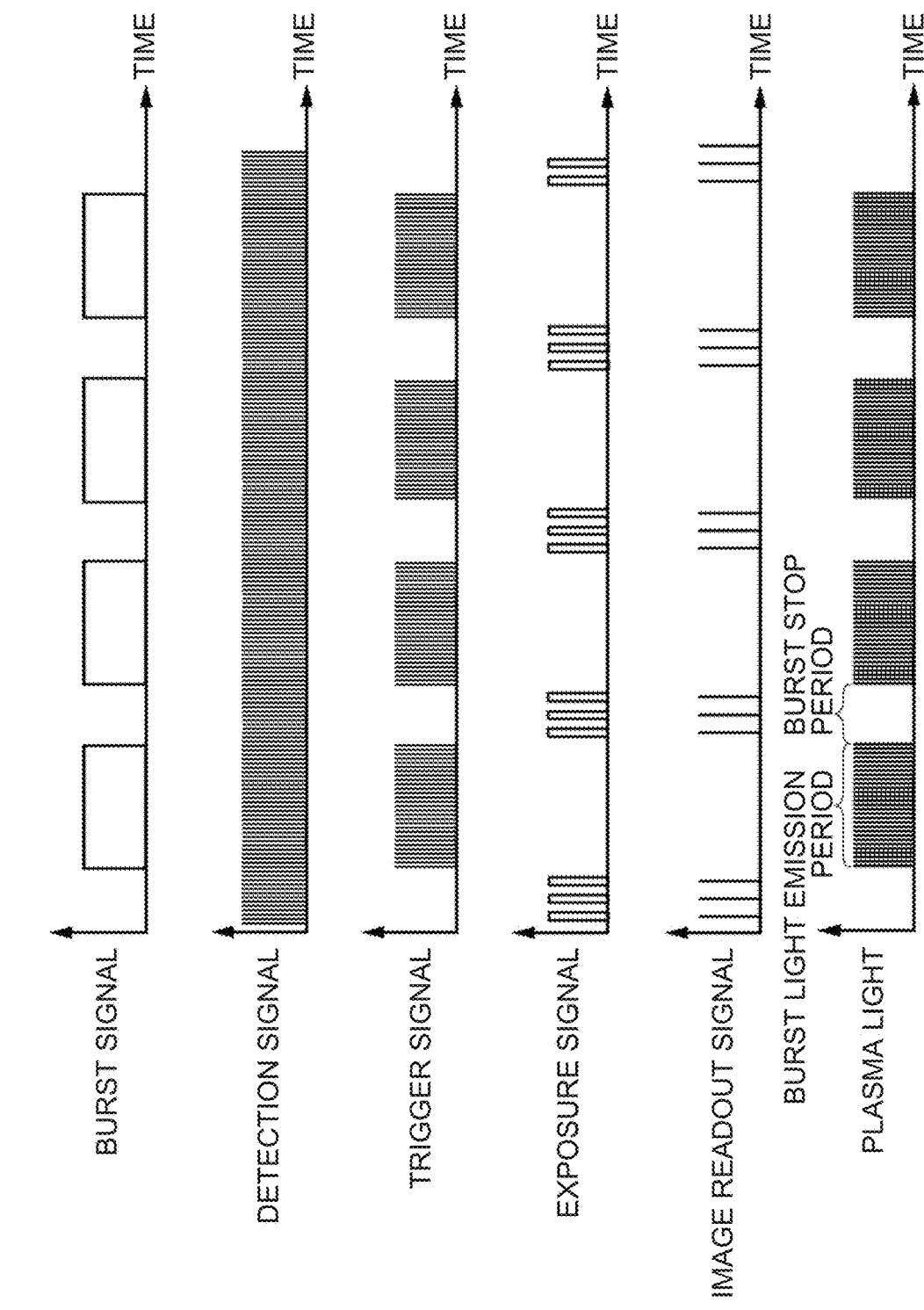
FIG. 5A is a time chart regarding acquisition of an image of a droplet in the controller illustrated in FIG. 2 during burst operation.

In view of the above, it has been considered to capture an image of the droplet 271 in the EUV light generation device 1 only during the burst stop period in the burst operation, as illustrated in FIG. 5A.

It should be noted that burst operation may be an operation of repeating a burst light emission period in which EUV light is continuously generated by the EUV light generation device 1 and a burst stop period in which EUV light is not generated. Burst operation may be used frequently at the time of wafer exposure by the exposure device 6.

Here, control performed by the controller 8 provided to the EUV light generation device 1 subject to burst operation will be described with reference to FIGS. 5A to 5C.

Figure 5B:
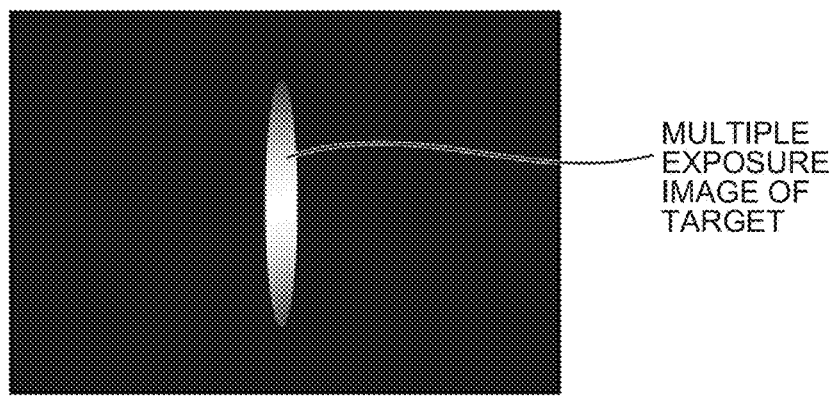
FIG. 5B illustrates an example of an image of a droplet captured by the image capturing unit of the trajectory image capturing unit illustrated in FIG. 2 during the burst operation.
Figure 5C:
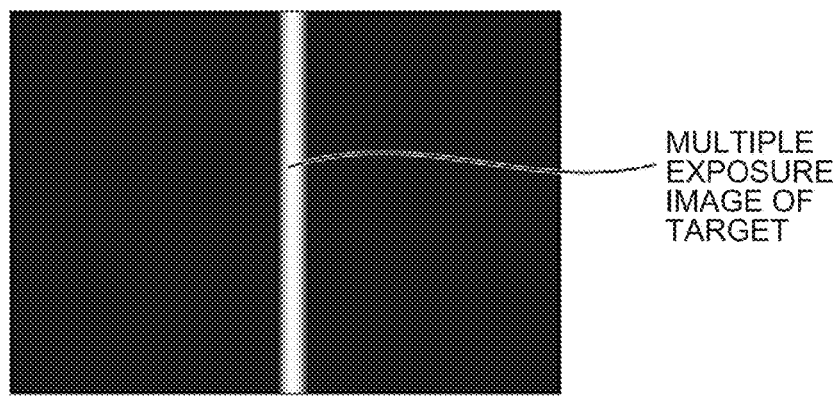
FIG. 5C illustrates another example of an image of a droplet captured by the image capturing unit of the trajectory image capturing unit illustrated in FIG. 2 during the burst operation.

In the control performed by the controller 8 illustrated in FIGS. 5A to 5C, regarding the configuration, control, and operation that are the same as those of the EUV light generation device 1 illustrated in FIG. 2, FIGS. 3A to 3C, and FIGS. 4A to 4C, description is omitted. It should be noted that an arrangement of the trajectory image capturing unit 42 serving as the basis of the control illustrated in FIGS. 5A to 5C may be an arrangement of the case where the distance between the droplet 271 an image of which is to be captured and the plasma generation region 25 is close to each other.

FIG. 5A is a time chart regarding control performed by the controller 8 accompanying burst operation, illustrating the case of performing image measurement of the droplet 271 that has reached near the plasma generation region 25.

The controller 8 may receive a burst signal from the exposure device 6 via the EUV light generation controller 5.

A burst signal may be a signal output from the exposure device 6 during the burst light emission period, as illustrated in FIG. 5A. A burst signal may also be a signal designating a burst light emission period and a burst stop period, for example.

The controller 8 may output a trigger signal at the timing when both a detection signal from the light receiving unit 412 of the droplet detector 41 and a burst signal from the exposure device 6 are input. Accordingly, the laser device 3 can output laser light only in the burst light emission period.

Further, the controller 8 may output an exposure signal only in the burst stop period. Accordingly, the trajectory image capturing unit 42 can capture an image of the droplet 271 only during the burst stop period in which plasma light is not emitted.

It should be noted that the timing of outputting an exposure signal may not be synchronized with the timing of inputting a detection signal.

By the control performed by the controller 8 as described above, it is possible to prevent the trajectory image capturing unit 42 from capturing an image in the burst light emission period. As such, the trajectory image capturing unit 42 can suppress capturing images of plasma light. Accordingly, the trajectory image capturing unit 42 can acquire an image of the droplet 271 not including plasma light, as illustrated in FIG. 5B, for example.

Further, in the case where the illumination range by the illumination light-source unit 421 at the trajectory position of the droplet 271 exceeds the angle of view of the image capturing unit 422 as described above, the trajectory image capturing unit 42 can acquire an image including a linear image of the droplet 271 but not including an image of plasma light, as illustrated in FIG. 5C, for example.

However, by the method described above, control of the trajectory of the droplet 271 can be performed only in the burst stop period. As such, during when plasma light is being generated, the trajectory of the droplet 271 can be in an uncontrolled state. Accordingly, there is a problem that even if the trajectory of the droplet 271 varies during emission of plasma light, the trajectory of the droplet 271 cannot be controlled so that stability of the operation of the EUV light generation device 1 is degraded.

6. Trajectory Image Capturing Unit Provided to EUV Light Generation Device of First Embodiment

[6.1 Configuration]

A configuration of a trajectory image capturing unit 42A provided to an EUV light generation device 1 of a first embodiment will be described with reference to FIG. 6.

Figure 6:
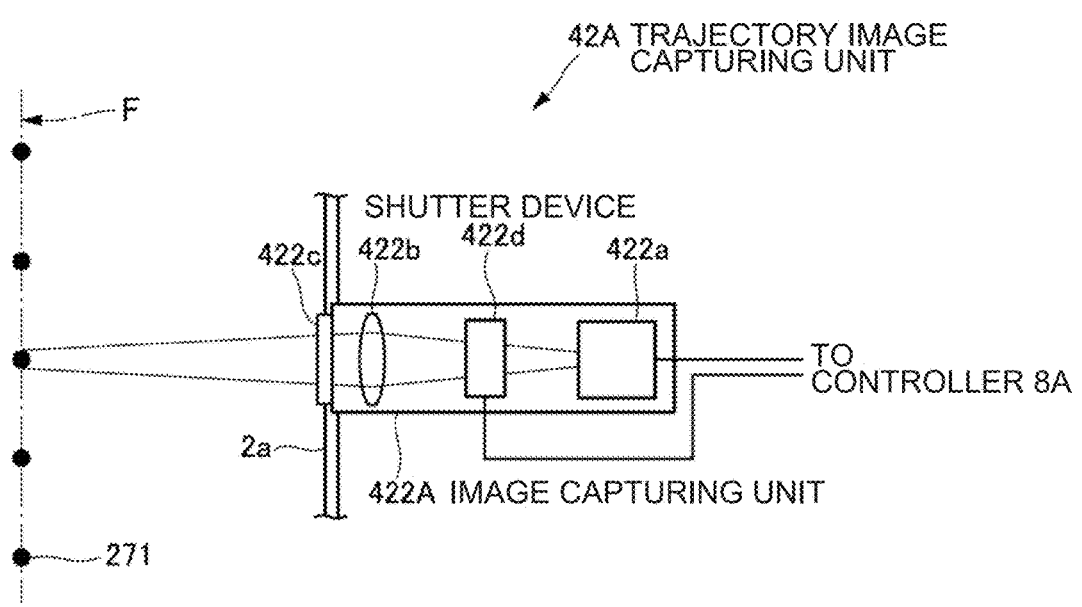
FIG. 6 is a drawing for explaining a configuration of an image capturing unit of a trajectory image capturing unit provided to an EUV light generation device of a first embodiment.

FIG. 6 is a drawing for explaining a configuration of an image capturing unit 422A of the trajectory image capturing unit 42A provided to the EUV light generation device 1.

In the image capturing unit 422A of the first embodiment, a shutter device 422d may be disposed, which is different from the image capturing unit 422 illustrated in FIG. 3C.

The shutter device 422d may be provided adjacent to a light receiving surface of the image capturing element 422a.

The other part of the configuration of the image capturing unit 422A of the first embodiment may be the same as that of the image capturing unit 422 illustrated in FIG. 3C.

In the configuration of the image capturing unit 422A of the first embodiment, description of the configuration that is the same as the configuration of the image capturing unit 422 illustrated in FIG. 3C is omitted.

The image capturing unit 422A of the trajectory image capturing unit 42A may include the shutter device 422d as illustrated in FIG. 6.

The shutter device 422d may be disposed between the image capturing element 422a and the imaging optical system 422b. The shutter device 422d may be connected with the controller 8A. The shutter device 422d may be an image intensifier unit (ITU) described below, for example.

The image capturing region of the trajectory image capturing unit 42A may include the plasma generation region 25.

The timing of capturing an image of the droplet 271 by the trajectory image capturing unit 42A may be the timing when the distance between the droplet 271 an image of which is to be captured and the plasma generation region 25 becomes several tens to several hundreds μm, for example.

[6.2 Operation]

Control performed by the controller 8A provided to the EUV light generation device 1 of the first embodiment will be described with reference to FIGS. 7A to 7D.

In the control by the controller 8A illustrated in FIGS. 7A to 7D, regarding the configuration, control, and operation that are the same as those of the EUV light generation device 1 illustrated in FIG. 2, FIGS. 3A to 3C, and FIGS. 4A to 4C, the description is omitted.

FIG. 7A is a time chart regarding the control performed by the controller 8A according to the first embodiment, illustrating the case of performing image measurement of the droplet 271 that has reached near the plasma generation region 25.

When a detection signal is input from the light receiving unit 412 of the droplet detector 41, the controller 8A may output a shutter open/close signal to the shutter device 422d at the timing delayed by a predetermined delay time TS.

The predetermined delay time TS may be determined such that a shutter open/close signal is output several μm is before the timing of generating plasma corresponding to a detection signal made upon detection of the droplet 271. The predetermined delay time TS may be determined such that a shutter open/close signal is output 0.2 μs to 8 μs before the timing of generating plasma, for example.

It is preferable that the predetermined delay time TS may be determined such that a shutter open/close signal is output before the timing of generating plasma by a time included in a range from 1 μs to 8 μs. Thereby, the shutter provided to the shutter device 422d can be opened before the timing of generating plasma by a time within a range from 1 μs to 8 μs.

It is also preferable that the predetermined delay time TS may be determined such that output of a shutter open/close signal is stopped before the timing of generating plasma by a time within a range from 0.2 μs to 1 μs. Thereby, the shutter provided to the shutter device 422d can be closed before the timing of generating plasma by a time within a range from 0.2 μs to 1 μs.

Here, the timing when a detection signal made upon detection of the droplet 271 is input to the controller 8A is defined as a "first timing".

The timing when the droplet 271 detected corresponding to the first timing is irradiated with laser light output from the laser device 3 so that plasma is generated is defined as a "second timing".

The controller 8A may output a shutter open/close signal to the shutter device 422d such that the shutter provided to the shutter device 422d is to be opened after the first timing and the shutter provided to the shutter device 422d is to be closed before the second timing.

The shutter open/close signal may be a signal for providing an instruction to open the shutter of the shutter device 422d so as to propagate reflected light from the droplet 271 to the image capturing element 422a and to close the shutter to cut off the plasma light.

The shutter open/close signal may be a signal that makes the shutter provided to the shutter device 422d open for several μs. The time during which the shutter is open may be a time within a range from 2 μs to 9.8 μs. The shutter open/close signal may be a signal that makes the shutter open for about 7 μs, for example.

The time during which the shutter provided to the shutter device 422d is open may be a time within a range from 20% to 98% of the cycle of generating plasma. For example, when the cycle of generating plasma is 10 μs, the time during which the shutter provided to the shutter device 422d is open may be a time within a range from 2 μs to 9.8 μs.

The cycle of generating plasma may be almost the same as the cycle of outputting a detection signal that is output upon detection of the droplet 271 by the droplet detector 41.

The shutter open/close signal may be a signal that makes the shutter provided to the shutter device 422d closed at the timing when a time of several us has passed from an instruction to open the shutter provided to the shutter device 422d. Accordingly, the shutter provided to the shutter device 422d can be closed at a point of time when plasma light is emitted, as illustrated in FIG. 7A. The point of time when plasma light is emitted can be the timing that plasma is generated.

It should be noted that the velocity of operation to open the shutter in the shutter device 422d and the velocity of operation to close the shutter each may be a velocity of operation of several hundreds ns or lower.

As illustrated in FIG. 7A, the controller 8A may output an exposure signal to the image capturing unit 422A of the trajectory image capturing unit 42A before outputting a shutter open/close signal. The controller 8A may start outputting of an exposure signal during the time from input of a detection signal to output of a shutter open/close signal.

The image capturing unit 422A may start image capturing when an exposure signal, output from the controller 8A, is input. The image capturing element 422a of the image capturing unit 422A can acquire an image during when the shutter of the shutter device 422d is open.

The controller 8A may output a trigger signal to the laser device 3 by adding the predetermined delay time TL to a detection signal, as illustrated in FIG. 7A.

The laser device 3 may output pulse laser light 31 when a trigger signal is input to the laser device 3.

The pulse laser light 31 may irradiate the droplet 271 via the laser light travel direction controller 34 and the laser light focusing mirror 22. Therefore, plasma light can be generated.

As illustrated in FIG. 7A, the controller 8A may output a shutter open/close signal to the shutter device 422d based on input of a detection signal of the droplet 271 during when an exposure signal is output to the image capturing element 422a, each time the detection signal is input. Alternatively, a shutter open/close signal may be output to the shutter device 422d based on input of a trigger signal, only during the burst light emission period.

As illustrated in FIG. 7A, the image capturing element 422a may capture an image of a different droplet 271 each time the shutter of the shutter device 422d is open during input of an exposure signal.

The image capturing element 422a may perform multiple exposure of images of a plurality of droplets 271 illuminated by the illumination light-source unit 421, during when the exposure signals are input.

The image capturing element 422a may perform multiple exposure of only images captured during the time when the shutter of the shutter device 422d is open.

As illustrated in FIG. 7A, since the shutter of the shutter device 422d is closed during the time when plasma light is emitted, plasma light made incident on the image capturing element 422a can be suppressed.

Alternatively, shutter open/close signals may be output to the shutter device 422d based on input of two detection signals by two different droplets. For example, the shutter may be opened based on a detection signal by a previous droplet and the shutter may be closed based on a detection signal by the subsequent droplet, for example.

The controller 8A may output an image readout signal for reading an image from the image capturing element 422a after output of an exposure signal is stopped. The controller 8A may acquire an image output from the image capturing element 422a.

Figure 7B:
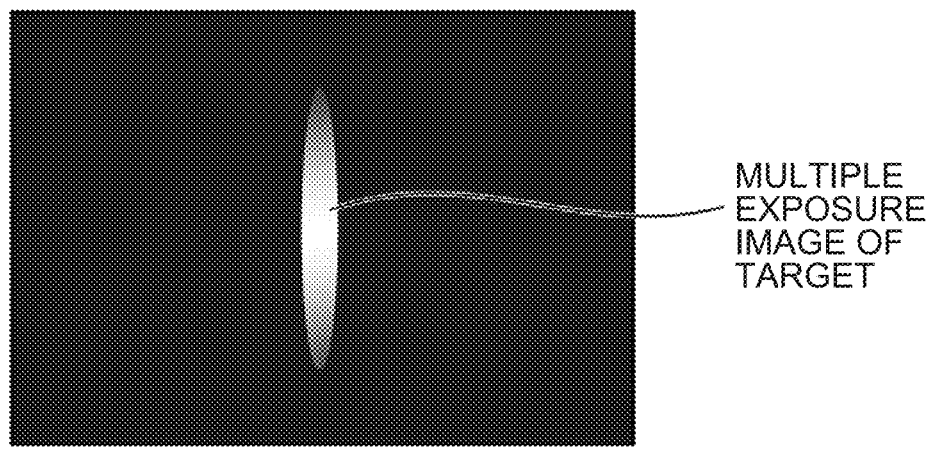
FIG. 7B illustrates an example of an image of a droplet captured by the image capturing unit of the trajectory image capturing unit illustrated in FIG. 6.

The controller 8A can acquire an image as illustrated in FIG. 7B, for example. The controller 8A can use the acquired image for controlling the trajectory of the droplet 271, which is similar to the case of the image illustrated in FIG. 4B.

FIG. 7C illustrates another example of a time chart regarding acquisition of an image of the droplet 271 by the controller 8A of the EUV light generation device 1 of the first embodiment.

The controller 8A may perform control as illustrated in FIG. 7C instead of the control as illustrated in FIG. 7A. Regarding control by the controller 8A illustrated in FIG. 7C, description of the same content as that described with reference to FIG. 7A is omitted.

The controller 8A may output a shutter open/close signal at the timing delayed by the delay time TS, described below, from the first timing, each time a detection signal of the droplet 271 is input at a 10 μs cycle, for example.

The delay time TS may be determined such that a shutter open/close signal is output 7 μs before the second timing.

The controller 8A may output a shutter open/close signal 7 μs before the second timing, and stop output of a shutter open/close signal 0.2 μs before the second timing.

This means that a shutter open/close signal can be a signal by which the shutter is opened 7 μs before the second timing and the shutter is closed 0.2 μs before the second timing.

Thereby, the shutter can be open for 6.8 μs. During when the shutter is open for 6.8 μs, the image capturing unit 422A can capture an image of the droplet 271 moving near the plasma generation position.

During the exposure time, the opening/closing timing of the shutter that is opened and closed a plurality of times can be in synchronization with the timing of detecting the droplet 271 by the droplet detector 41.

Figure 7D:
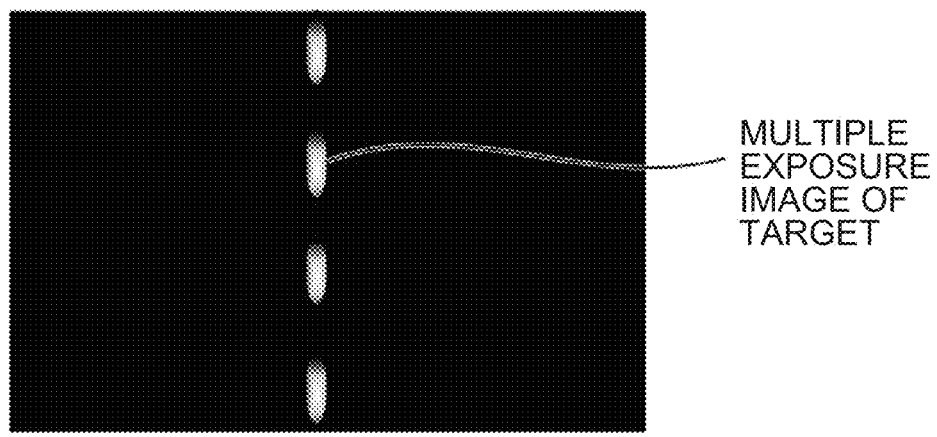
FIG. 7D illustrates another example of an image of a droplet captured by the image capturing unit of the trajectory image capturing unit illustrated in FIG. 6.

Accordingly, images of different droplets 271, on which multiple exposure is performed by the trajectory image capturing unit 42A, can be overlapped with each other at almost the same position and made into a dashed line. The controller 8A may acquire an image of the droplet 271 in a dashed line as illustrated in FIG. 7D, for example.

[6.3 Effect]

According to the trajectory image capturing unit 42A of the first embodiment, it is possible to suppress incidence of plasma light, generated in the plasma generation region 25, on the image capturing element 422a by the operation of the shutter device 422d.

Further, the trajectory image capturing unit 42A can capture an image of the droplet 271 located in the vicinity of the plasma generation position. The trajectory image capturing unit 42A can perform multiple exposure on images of different droplets 271 in the vicinity of the plasma generation position.

As such, the trajectory image capturing unit 42A can acquire an image of the droplet 271 not including plasma light, while performing multiple exposure on images of different droplets 271 in the vicinity of the plasma generation position.

Accordingly, the controller 8A can improve the accuracy of the trajectory control of the droplet 271 based on the image acquired by the trajectory image capturing unit 42A.

Further, even during generation of plasma light in the burst light emission period, trajectory control of the droplet 271 can be made. Therefore, stability of the operation of the EUV light generation device can be improved.

7. Trajectory Image Capturing Unit Provided to EUV Light Generation Device of Modification 1 of First Embodiment

[7.1 Configuration]

A configuration of a trajectory image capturing unit 42B provided to an EUV light generation device 1 of a modification 1 of the first embodiment will be described with reference to FIG. 8.

Figure 8:
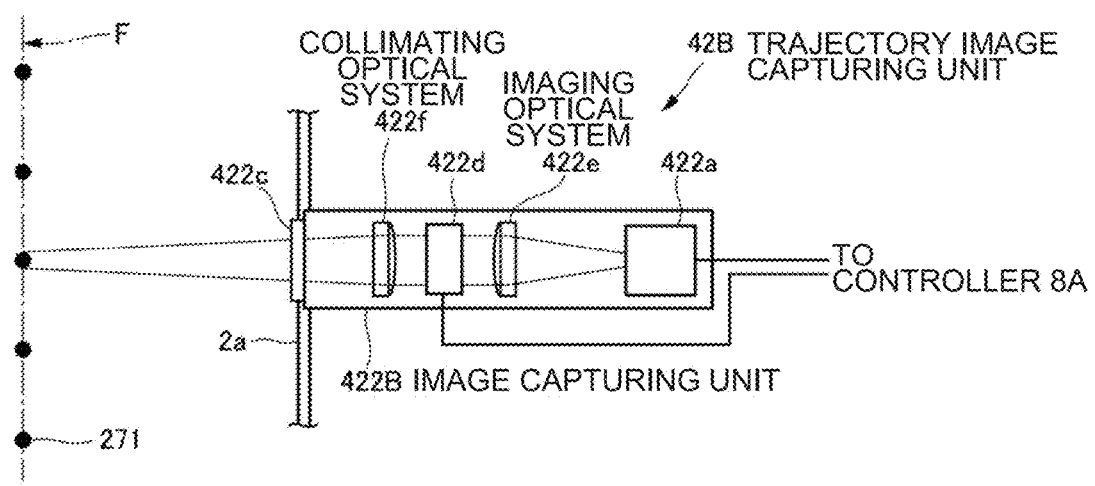
FIG. 8 is a drawing for explaining a configuration of an image capturing unit of a trajectory image capturing unit according to a modification 1 of the first embodiment.

FIG. 8 is a drawing for explaining a configuration of an image capturing unit 422B of the trajectory image capturing unit 42B provided to the EUV light generation device 1 according to the modification 1 of the first embodiment.

In the image capturing unit 422B of the modification 1 of the first embodiment, a collimating optical system 422f may be disposed, which is different from the image capturing unit 422A of the first embodiment illustrated in FIG. 6.

Further, in the image capturing unit 422B of the modification 1 of the first embodiment, an imaging optical system 422e may be disposed between the shutter device 422d and the image capturing element 422a, which is different from the image capturing unit 422A of the first embodiment illustrated in FIG. 6.

The other part of the configuration of the image capturing unit 422B of the modification 1 of the first embodiment may be the same as the configuration of the image capturing unit 422A illustrated in FIG. 6.

Regarding the configuration of the image capturing unit 422B of the modification 1 of the first embodiment, description of the configuration that is the same as the configuration of the image capturing unit 422A illustrated in FIG. 6 is omitted.

The shutter device 422d may be disposed between the collimating optical system 422f and the imaging optical system 422e.

The collimating optical system 422f may be configured to collimate reflected light from the droplet 271 so as to allow the light to be made incident on the shutter device 422d.

The imaging optical system 422e may be configured to form an image of light that is collimated by the collimating optical system 422f and penetrates the shutter device 422d, on the light receiving surface of the image capturing element 422a.

[7.2 Effect]

According to the image capturing unit 422B of the modification 1 of the first embodiment, collimated light can be made incident on the shutter device 422d. Accordingly, in the case where the shutter provided to the shutter device 422d is a polarizing shutter or the like, distortion of the image of the droplet 271, which is caused because the light penetrates the shutter device 422d, can be suppressed.

Therefore, measurement accuracy of the trajectory of the droplet 271 based on the image acquired by the image capturing unit 422B can be improved.

8. Trajectory Image Capturing Unit Provided to EUV Light Generation Device of Modification 2 of First Embodiment

[8.1 Configuration]

A configuration of a trajectory image capturing unit 42C provided to an EUV light generation device 1 of a modification 2 of the first embodiment will be described with reference to FIG. 9.

Figure 9:
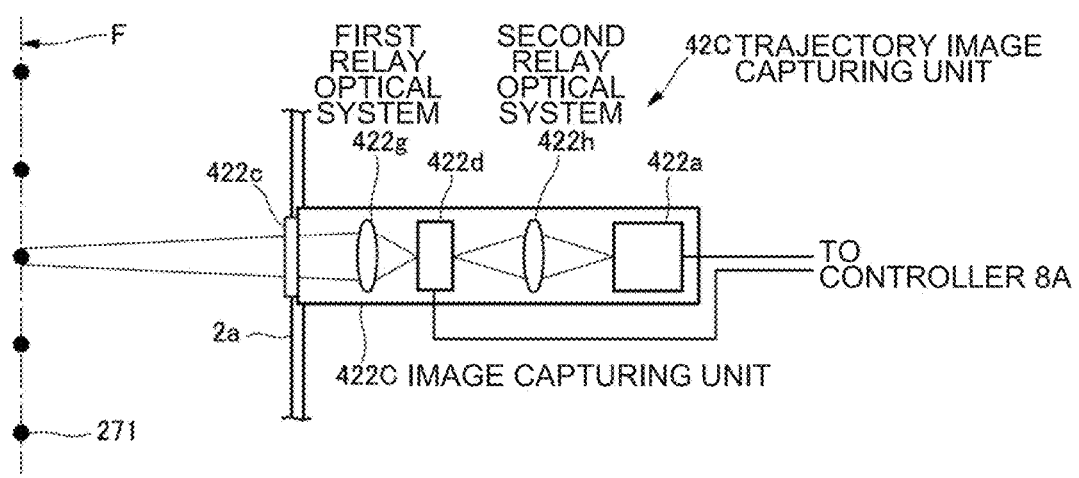
FIG. 9 is a drawing for explaining a configuration of an image capturing unit of a trajectory image capturing unit according to a modification 2 of the first embodiment.

FIG. 9 is a drawing for explaining a configuration of an image capturing unit 422C of the trajectory image capturing unit 42C provided to the EUV light generation device 1 according to the modification 2 of the first embodiment.

In the image capturing unit 422C of the modification 2 of the first embodiment, a first relay optical system 422g and a second relay optical system 422h may be disposed, which is different from the image capturing unit 422A illustrated in FIG. 6 and the image capturing unit 422B illustrated in FIG. 8.

In the image capturing unit 422C of the modification 2 of the first embodiment, the first relay optical system 422g and the second relay optical system 422h may be disposed instead of the collimating optical system 422f and the imaging optical system 422e in the image capturing unit 422B illustrated in FIG. 8.

The other part of the configuration of the image capturing unit 422C according to the modification 2 of the first embodiment may be the same as the configuration of the image capturing unit 422B illustrated in FIG. 8.

Regarding the configuration of the image capturing unit 422C according to the modification 2 of the first embodiment, description of the configuration that is the same as the configuration of the image capturing unit 422A illustrated in FIG. 6 and the configuration of the image capturing unit 422B illustrated in FIG. 8 is omitted.

The shutter device 422d may be disposed between the first relay optical system 422g and the second relay optical system 422h.

The first relay optical system 422g may be configured to image the reflected light from the droplet 271 on the light receiving surface of the shutter device 422d.

The second relay optical system 422h may be configured to image the light penetrating the shutter device 422d on the light receiving surface of the image capturing element 422a.

[8.2 Effect]

According to the image capturing unit 422C of the modification 2 of the first embodiment, an image of the droplet 271 can be formed on the light receiving surface of the shutter device 422d. Accordingly, in the case where the shutter provided to the shutter device 422d is an image intensifier (IIU) using a micro channel plate (MCP) or the like, a blur of an image of the droplet 271, which is caused because it penetrates the shutter device 422d, can be suppressed.

Therefore, measurement accuracy of the trajectory of the droplet 271 based on an image acquired by the image capturing unit 422C can be improved.

9. Trajectory Image Capturing Unit Provided to EUV Light Generation Device of Modification 3 of First Embodiment

[9.1 Configuration]

A configuration of a trajectory image capturing unit 42D provided to an EUV light generation device 1 of a modification 3 of the first embodiment will be described with reference to FIG. 10.

Figure 10:
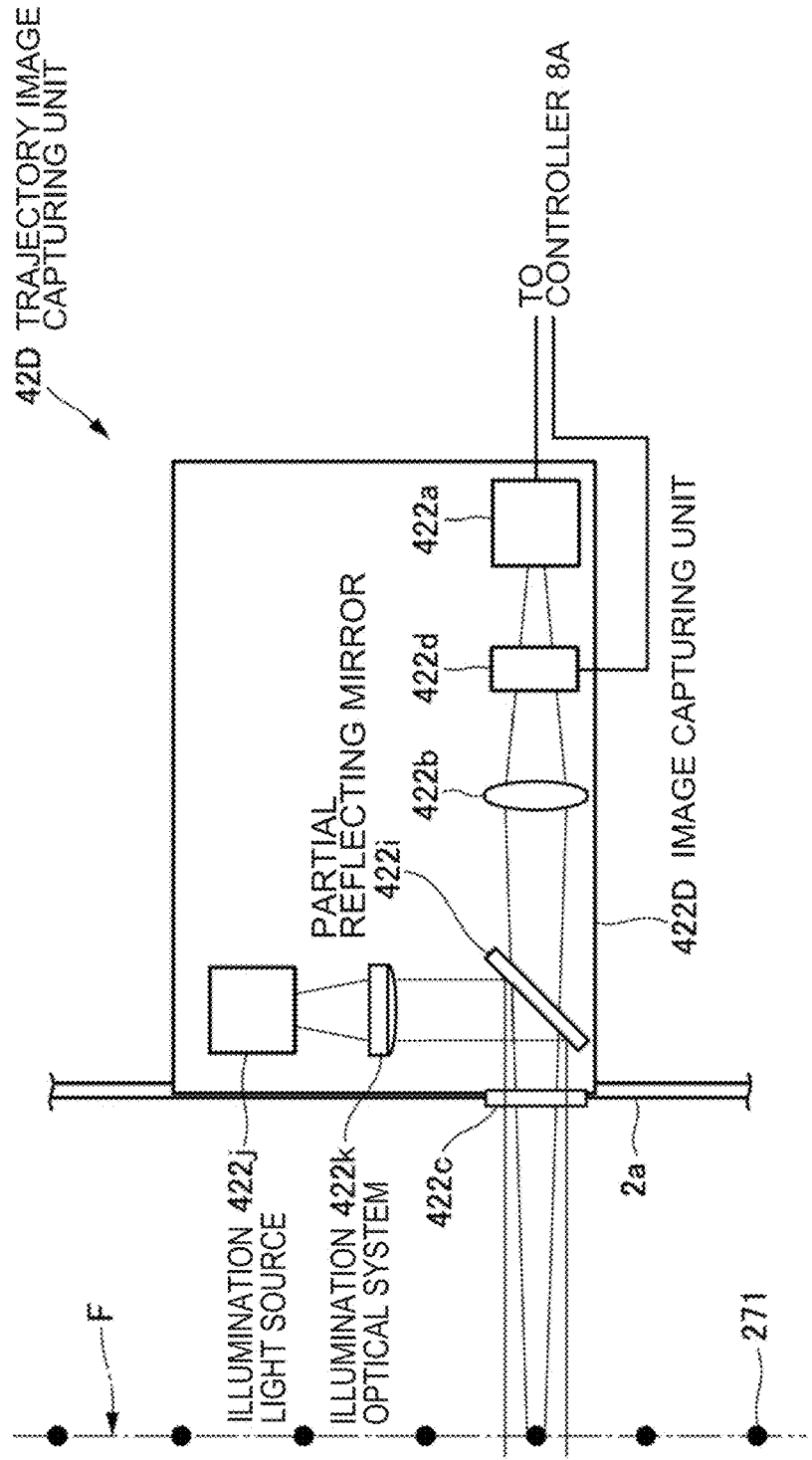
FIG. 10 is a drawing for explaining a configuration of a trajectory image capturing unit according to a modification 3 of the first embodiment.

FIG. 10 is a drawing for explaining a configuration of the trajectory image capturing unit 42D provided to the EUV light generation device 1 according to the modification 3 of the first embodiment.

In an image capturing unit 422D of the modification 3 of the first embodiment, a partial reflecting mirror 422i may be disposed, which is different from the image capturing unit 422A illustrated in FIG. 6, the image capturing unit 422B illustrated in FIG. 8, and the image capturing unit 422C illustrated in FIG. 9.

In the image capturing unit 422D of the modification 3 of the first embodiment, an illumination light source 422j and an illumination optical system 422k may be disposed in the image capturing unit 422A illustrated in FIG. 6.

The other part of the configuration of the image capturing unit 422D of the modification 3 of the first embodiment may be the same as the configuration of the image capturing unit 422A illustrated in FIG. 6.

Regarding the configuration of the image capturing unit 422D according to the modification 3 of the first embodiment, description of the configuration that is the same as the configurations of the image capturing unit 422A illustrated in FIG. 6, the image capturing unit 422B illustrated in FIG. 8, and the image capturing unit 422C illustrated in FIG. 9, is omitted.

The image capturing unit 422D may be provided with the partial reflecting mirror 422i as illustrated in FIG. 10.

The image capturing unit 422D may have the image capturing element 422a, the imaging optical system 422b, the shutter device 422d, the partial reflecting mirror 422i, the illumination light source 422j, and the illumination optical system 422k, in the same casing.

The partial reflecting mirror 422i may reflect illumination light, output from the illumination light source 422j, toward the droplet 271.

The partial reflecting mirror 422*i* may allow the reflected light from the droplet 271, caused because the droplet 271 is irradiated with illumination light, to penetrate the imaging optical system 422*b*.

A window 422*c* may transmit the illumination light output from the illumination light source 422*j* and the reflected light from the droplet 271.

The partial reflecting mirror 422*i* may be a polarization beam splitter. In that case, it is preferable that the illumination light source 422*j* outputs polarized light to be reflected by the polarization beam splitter, and that a λ/4 plate is disposed on the optical path from the partial reflecting mirror 422*i* to the droplet 271. Alternatively, in the case where the illumination light source 422*j* outputs polarized light that penetrates the polarization beam splitter, a λ/2 plate may be disposed on the illumination optical path from the illumination light source 422*j* to the partial reflecting mirror 422*i*.

[9.2 Effect]

According to the image capturing unit 422D of the modification 3 of the first embodiment, the trajectory image capturing unit 42D can be configured to be compact.

Further, as it is possible to detect reflected light from a direction in which illumination light is radiated to the droplet 271, measurement accuracy of the image of the droplet 271 can be improved.

10. Trajectory Image Capturing Unit Provided to EUV Light Generation Device of Second Embodiment

[10.1 Configuration]

A configuration of a trajectory image capturing unit 42E provided to an EUV light generation device 1 of a second embodiment will be described with reference to FIG. 11.

Figure 11:
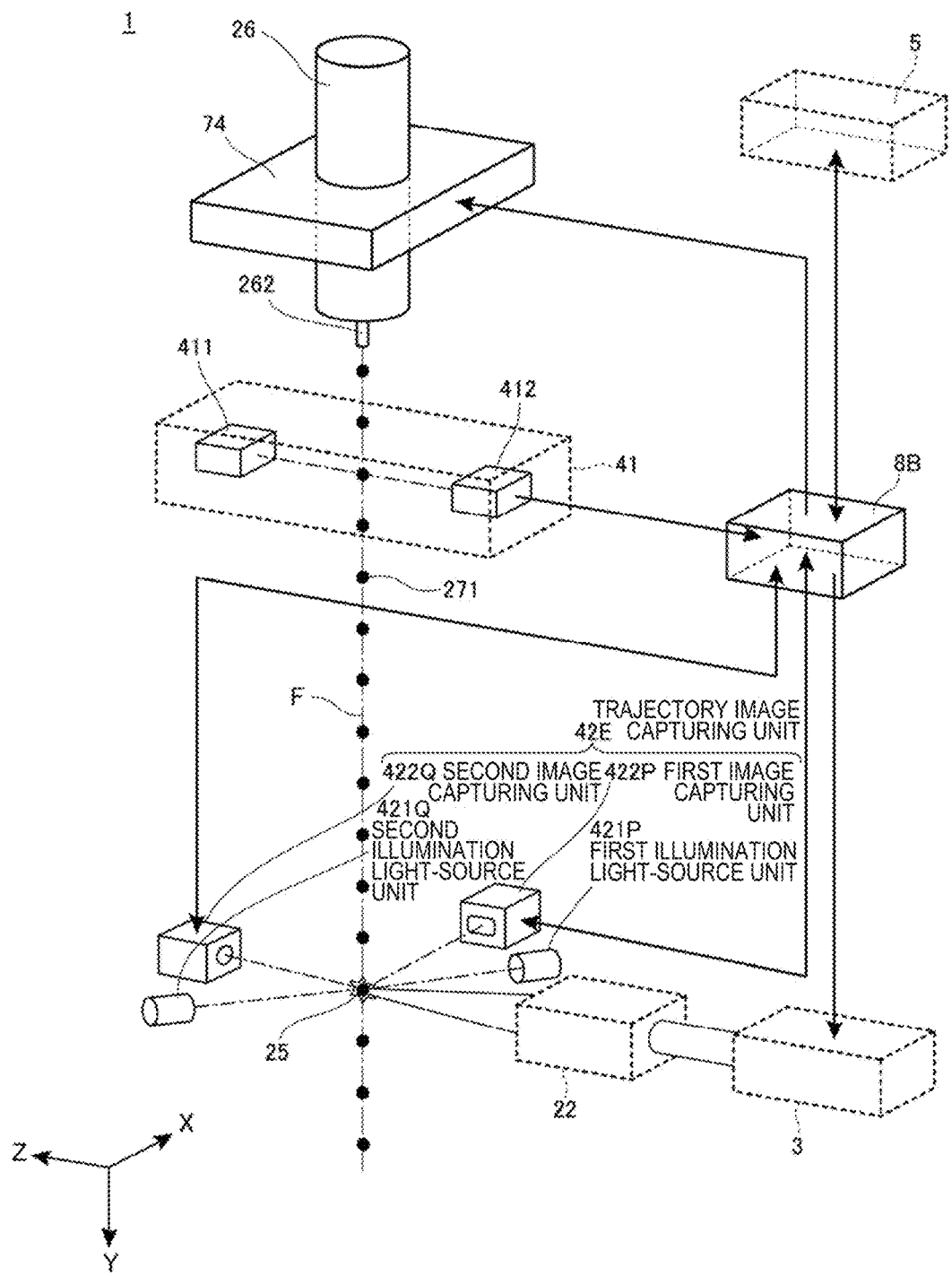
FIG. 11 is a drawing for explaining a configuration of an EUV light generation device provided with a trajectory image capturing unit according to a second embodiment.

FIG. 11 is a drawing for explaining a configuration of the trajectory image capturing unit 42E provided to the EUV light generation device 1 of the second embodiment.

In the trajectory image capturing unit 42E of the second embodiment, a second illumination light-source unit 421Q and a second image capturing unit 422Q may be disposed in addition to a first illumination light-source unit 421P and a first image capturing unit 422P, which is different from the trajectory image capturing unit 42 illustrated in FIG. 2.

The other part of the configuration of the trajectory image capturing unit 42E of the second embodiment may be the same as the configuration of the trajectory image capturing unit 42 illustrated in FIG. 2.

Regarding the configuration of the trajectory image capturing unit 42E of the second embodiment, description of the configuration that is the same as the configuration of the trajectory image capturing unit 42 illustrated in FIG. 2 is omitted.

As illustrated in FIG. 11, the trajectory image capturing unit 42E of the second embodiment may include the first illumination light-source unit 421P, the first image capturing unit 422P, the second illumination light-source unit 421Q, and the second image capturing unit 422Q.

The first image capturing unit 422P may be disposed so as to capture an image of the droplet 271 from the X axis direction, for example.

The second image capturing unit 422Q may be disposed so as to capture an image of the droplet 271 from the Z axis direction, for example.

Image capturing regions of the first image capturing unit 422P and the second image capturing unit 422Q may include the plasma generation region 25.

The timing of capturing images of the droplet 271 by the first image capturing unit 422P and the second image capturing unit 422Q may be the timing when the distance between the droplet 271 an image of which is to be captured and the plasma generation region 25 becomes several tens to hundreds μm, for example.

The first illumination light-source unit 421P may be disposed such that reflected light from the droplet 271 is made incident on the first image capturing unit 422P.

The second illumination light-source unit 421Q may be disposed such that reflected light from the droplet 271 is made incident on the second image capturing unit 422Q.

The target stage 74 may be a stage configured to move the target supply unit 26 in the X axis direction and the Z axis direction, for example, which is the same as that of the EUV light generation device 1 illustrated in FIG. 2.

The target stage 74 may move the target supply unit 26 in a direction orthogonal to the X axis direction of capturing an image by the first image capturing unit 422P, that is, in the Z axis direction.

Further, the target stage 74 may move the target supply unit 26 in a direction orthogonal to the Z axis direction of capturing an image by the second image capturing unit 422Q, that is, in the X axis direction.

The moving directions of the target stage 74 and the image capturing directions by the first image capturing unit 422P and the second image capturing unit 422Q may not be limited to the X axis direction and the Z axis direction.

It is also acceptable that one moving direction of the target stage 74 is orthogonal to the image capturing direction of the first image capturing unit 422P and the other moving direction of the target stage 74 is orthogonal to the image capturing direction of the second image capturing unit 422Q.

[10.2 Operation]

Control performed by a controller 8B provided to the EUV light generation device 1 of the second embodiment illustrated in FIG. 11 will be described.

Regarding the control performed by the controller 8B illustrated in FIG. 11, description of the control and operation that are the same as those of the EUV light generation device 1 illustrated in FIGS. 4A to 4C and FIGS. 7A to 7D is omitted.

The controller 8B may output an exposure signal to the first image capturing unit 422P and the second image capturing unit 422Q. Further, the controller 8B may acquire respective images of the droplets 271 acquired by being captured from the respective image capturing directions, from the first image capturing unit 422P and the second image capturing unit 422Q.

The controller 8B may calculate the moving amount of the target stage 74 in a direction orthogonal to the image capturing direction of the first image capturing unit 422P, based on the image input from the first image capturing unit 422P.

The controller 8B may move the target stage 74 based on the calculated moving amount, in a direction orthogonal to the image capturing direction of the first image capturing unit 422P.

The controller 8B may calculate the moving amount of the target stage 74 in a direction orthogonal to the image capturing direction of the second image capturing unit 422Q, based on the image input from the second image capturing unit 422Q.

The controller 8B may move the target stage 74 based on the calculated moving amount, in a direction orthogonal to the image capturing direction of the second image capturing unit 422Q.

[10.3 Effect]

According to the trajectory image capturing unit 42E of the second embodiment, images of the droplet 271 can be acquired from two directions by the first image capturing unit 422P and the second image capturing unit 422Q.

Therefore, accuracy of the trajectory control of the droplet 271 can be improved based on the respective images output from the first image capturing unit 422P and the second image capturing unit 422Q.

11. Trajectory Image Capturing Unit Provided to EUV Light Generation Device of Third Embodiment

[11.1 Configuration]

A configuration of a trajectory image capturing unit 42F provided to an EUV light generation device 1 of a third embodiment will be described with reference to FIGS. 12A and 12B.

Figure 12A:
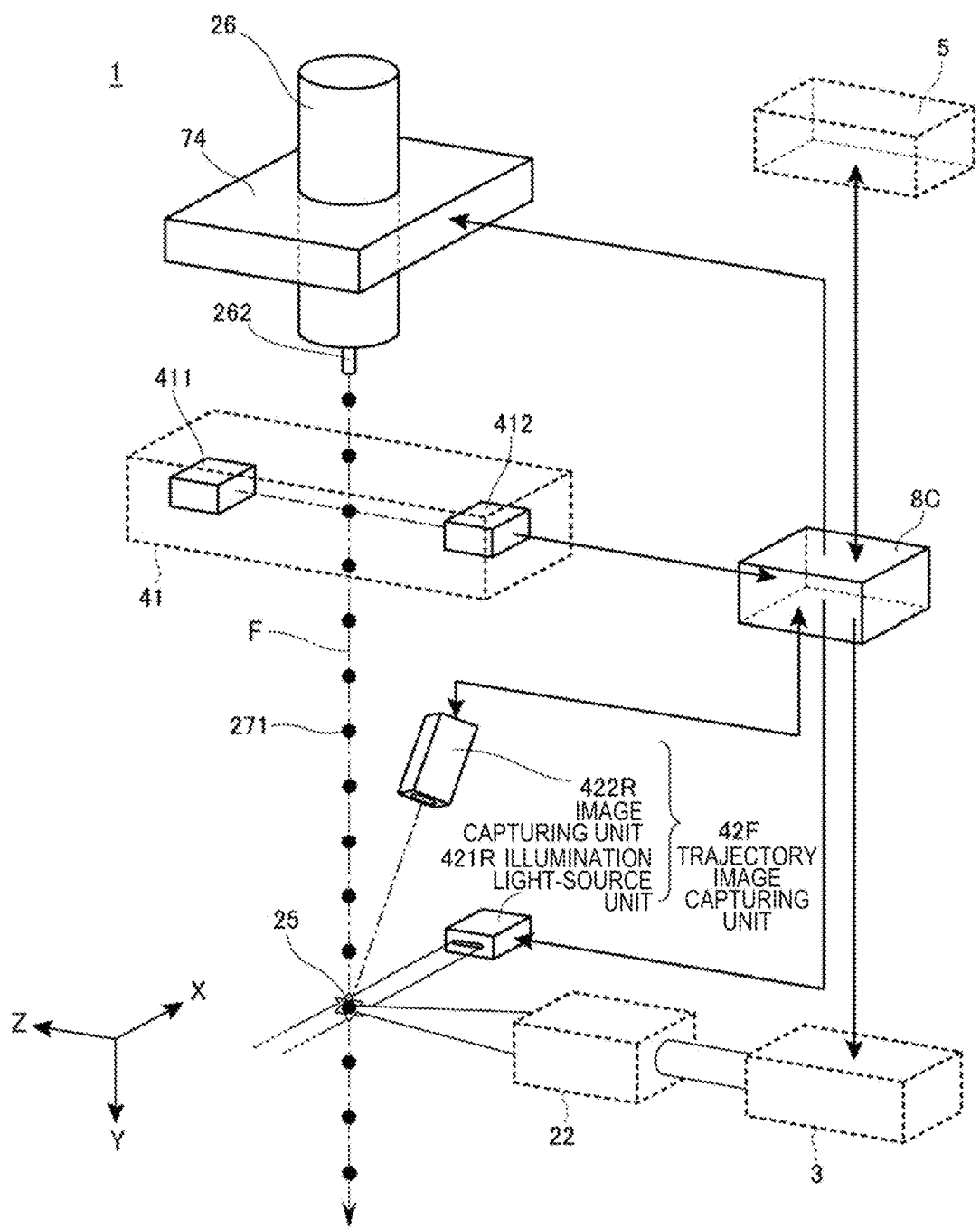
FIG. 12A is a drawing for explaining a configuration of an EUV light generation device provided with a trajectory image capturing unit according to a third embodiment.

FIG. 12A is a drawing for explaining a configuration of the trajectory image capturing unit 42F provided to the EUV light generation device 1 of the third embodiment.

Different from the trajectory image capturing unit 42 illustrated in FIG. 2 and the trajectory image capturing unit 42E illustrated in FIG. 11, in the trajectory image capturing unit 42F of the third embodiment, an image capturing unit 422R included in the trajectory image capturing unit 42F may be disposed such that the image capturing direction of the image capturing unit 422R becomes a direction substantially along with the trajectory direction of the droplet 271.

The other part of the configuration of the trajectory image capturing unit 42F of the third embodiment may be the same as the configuration of the trajectory image capturing unit 42 illustrated in FIG. 2.

Regarding the configuration of the trajectory image capturing unit 42F of the third embodiment, description of the configuration that is the same as the configuration of the trajectory image capturing unit 42 illustrated in FIG. 2 is omitted.

The image capturing unit 422R may be disposed such that the image capturing direction becomes a direction substantially parallel to the trajectory direction (Y axis direction, for example) of the droplet 271, as illustrated in FIG. 12A.

The image capturing unit 422R may be disposed such that an angular difference between the image capturing direction and the trajectory direction of the droplet 271 is decreased.

Alternatively, the image capturing unit 422R may be disposed such that the image capturing direction becomes substantially perpendicular to the moving direction of the target stage 74.

Figure 12B:
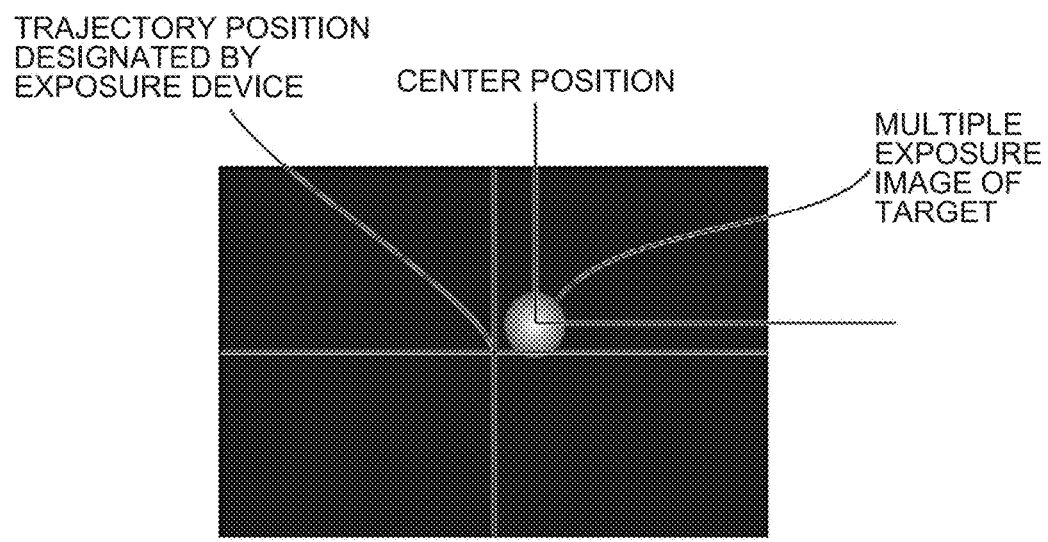
FIG. 12B illustrates an example of an image of a droplet captured by an image capturing unit of the trajectory image capturing unit illustrated in FIG. 12A.

In the trajectory image capturing unit 42F of the third embodiment, horizontal and vertical directions on an image acquired by the image capturing unit 422R may be substantially identical to the two directions that are moving directions of the target stage 74, as illustrated in FIG. 12B.

The image capturing region of the image capturing unit 422R may include the plasma generation region 25.

The timing of capturing the image of the droplet 271 by the image capturing unit 422R may be the timing when the distance between the droplet 271 an image of which is to be imaged and the plasma generation region 25 becomes several tens to several hundreds μm, for example.

[11.2 Effect]

According to the trajectory image capturing unit 42F of the third embodiment, it is possible to acquire an image of the droplet 271 in which the image capturing direction thereof is substantially parallel to the travel direction of the droplet 271, as illustrated in FIG. 12B, for example.

As such, a distance difference between the trajectory position designated by the droplet 271 requested from the exposure device 6 and the actual trajectory position of the droplet 271 on a single image can be specified in two directions. Therefore, it is possible to achieve an effect that is the same as the case of acquiring a plurality of images by capturing images from different directions.

12. Shutter Device

[12.1 Image Intensifier Unit]

Figure 13A:
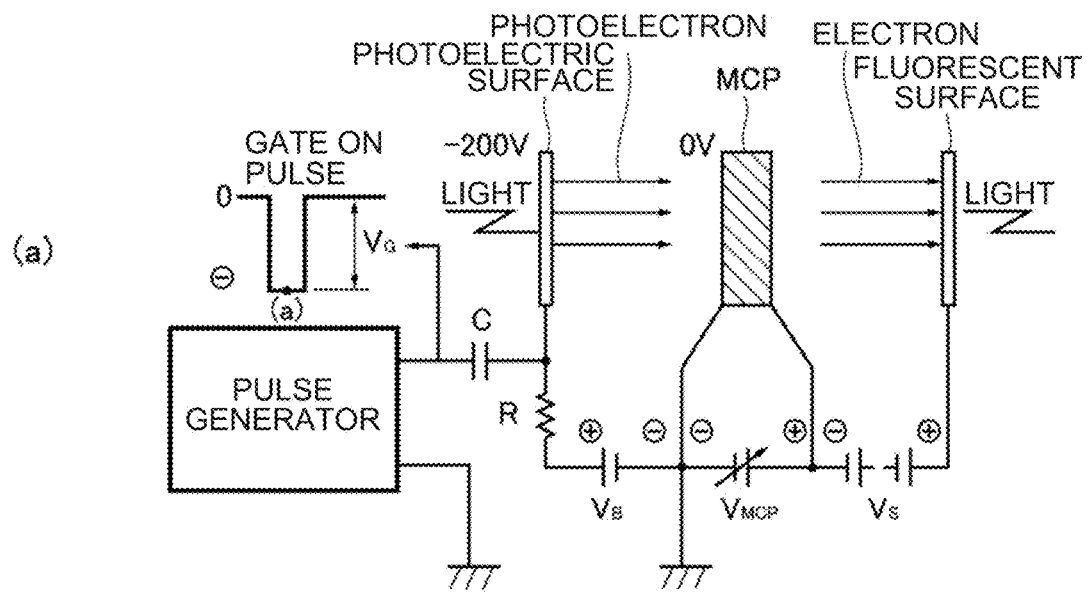
FIG. 13A illustrates a configuration of an exemplary image intensifier unit of a shutter device.
Figure 13A:
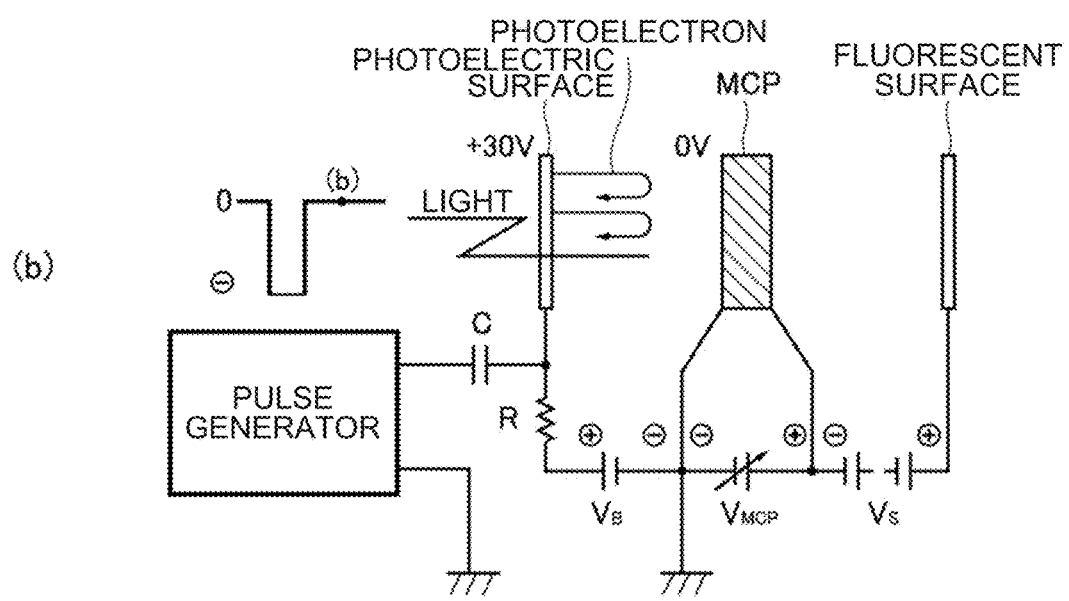
Figure 13B:
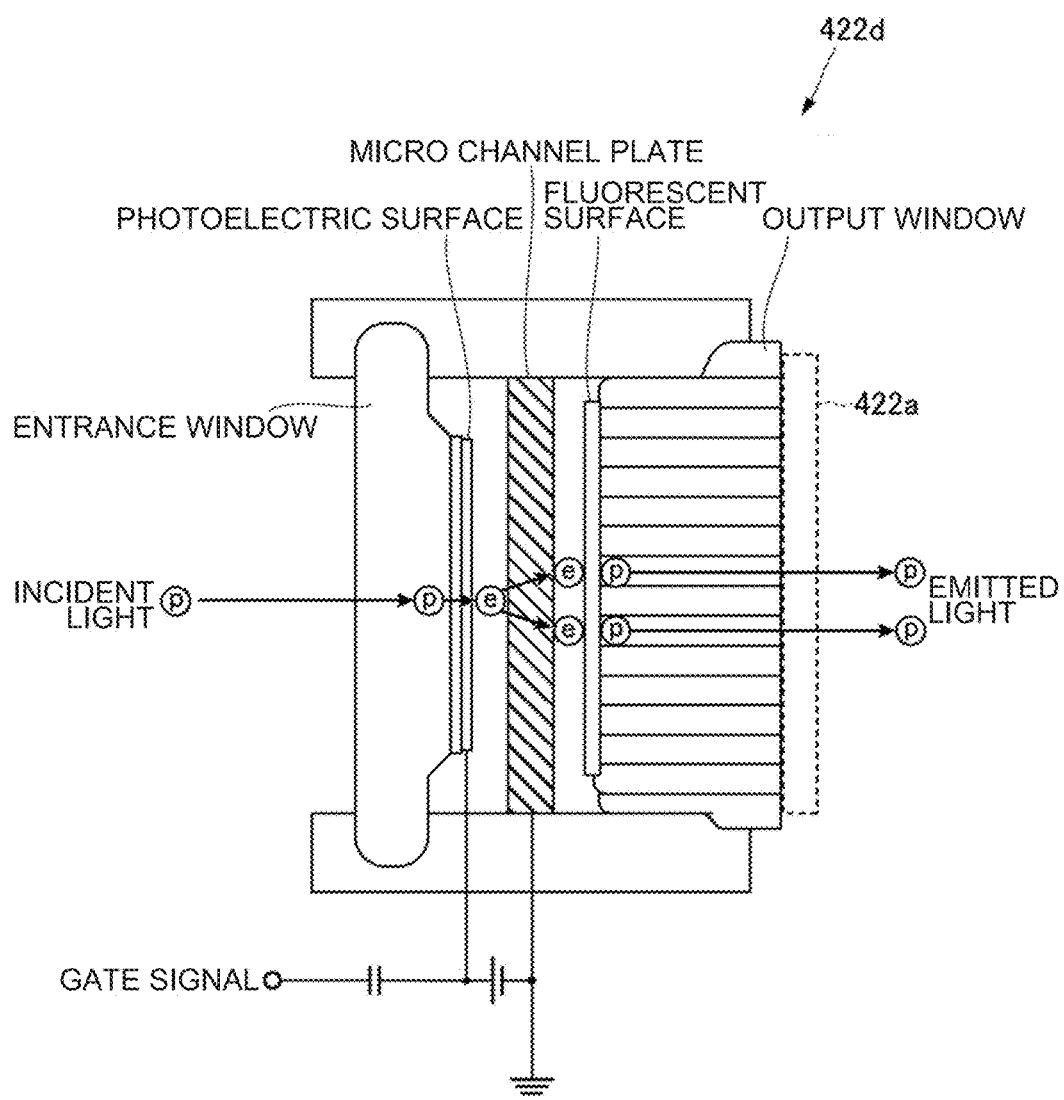
FIG. 13B illustrates the configuration of the exemplary image intensifier unit of the shutter device.

The shutter device 422d included in the image capturing units 422A to 422D, the first image capturing unit 422P, the second image capturing unit 422Q, and the image capturing unit 422R may have a configuration as illustrated in portions (a) and (b) of FIG. 13A and FIG. 13B.

The shutter device 422d illustrated in the portions (a) and (b) of FIG. 13A and FIG. 13B may be an image intensifier (hereinafter referred to as IIU) using a micro channel plate (hereinafter referred to as MCP).

The IIU may be a vacuum tube configured to amplify photoelectron, emitted from the photoelectric surface by incident light, and form an image on a fluorescent surface and make it emit light, and is capable of acquiring an optical image.

Here, an operation principle of the IIU using the MCP will be described with reference to the portions (a) and (b) of FIG. 13A.

The IIU using the MCP may include a photoelectric surface, the MCP, and a fluorescent surface, as illustrated in the portions (a) and (b) of FIG. 13A.

The photoelectric surface and the fluorescent surface may be disposed with the MCP being interposed between them.

The IIU may be configured to give a potential difference between the MCP and the photoelectric surface according to ON or OFF of a gate signal.

As illustrated in the portion (a) of FIG. 13A, the IIU may be configured such that when the gate signal is ON, the potential of the photoelectric surface is lower than the potential on the input side of the MCP. In that case, the photoelectron emitted from the photoelectric surface can reach the MCP due to the potential difference.

Accordingly, when the gate signal is ON, the photoelectron emitted from the photoelectric surface is multiplied by the MCP, and the image capturing element 422a can receive an optical image corresponding to the multiplied electron.

Meanwhile, when the gate signal is OFF as illustrated in the portion (b) of FIG. 13A, the potential of the photoelectric surface may be higher than the potential on the input side of the MCP. In that case, the photoelectron emitted from the photoelectric surface is brought hack to the photoelectric surface and cannot reach the MCP. Accordingly, when the gate signal is OFF, photoelectron emitted from the photoelectric surface is not multiplied by the MCP, and the image capturing element 422a cannot receive an optical image.

In this way, the IIU illustrated in the portions (a) and (b) of FIG. 13A can realize a shutter function according to ON or OFF of the gate signal.

Next, operation of an actual IIU will be described with reference to FIG. 13B. An IIU illustrated in FIG. 13B may include an entrance window, a photoelectric surface, an MCP, a fluorescent surface, and an output window.

It should be noted that in FIG. 13B, "p" represents a photon and "e" represents an electron.

An entrance window may guide incident light to a photoelectric surface.

An image of the droplet 271 to be captured may be formed on the photoelectric surface via the entrance window.

The photoelectric surface may convert the incident light into a photoelectron and emit it to the MCP.

The MCP may be formed to have a structure in which a plurality of channels transmitting photoelectrons are bundled. When a photoelectron collides with a wall in the channel at the time of penetrating the channel, the MCP may emit a secondary electron. Thereby, the MCP may multiply the photoelectron emitted from the photoelectric surface and emit the secondary electron to the fluorescent surface.

The fluorescent surface may convert the electron multiplied by the MCP into light and guide it to the output window.

The output window may be provided adjacent to the light receiving surface of the image capturing element 422a. The output window may guide the light, guided from the fluorescent surface, to the image capturing element 422a as emitted light. The image capturing element 422a may receive the emitted light as an optical image. The output window may include a fiber optic plate configured to guide light of the fluorescent surface.

It should be noted that a transfer lens for transferring the optical image of the fluorescent surface to the light receiving surface of the image capturing element 422a may be provided between the output window and the image capturing element 422a, although not illustrated.

The shutter device 422d may be a CCD electronic shutter if it can realize shutter function even when plasma light is radiated.

[12.2 PLZT Polarizing Shutter]

The shutter device 422d may also be a PLZT polarizing shutter. The PLZT polarizing shutter may be configured such that a plurality of polarizing plates are disposed in a crossed Nicol direction via piezoelectric ceramics. Then, by applying voltage to the piezoelectric ceramics provided between the polarizing plates, it is possible to change the polarizing direction of the polarizing plate to realize a shutter function.

The shutter device 422d may combine the various types of shutters described above and a mechanical shutter.

13. Trajectory Image Capturing Unit Provided to EUV Light Generation Device of Fourth Embodiment

[13.1 Configuration]

An EUV light generation device 1 of a fourth embodiment may be configured such that the shutter device 422d in the EUV light generation device 1 of the first embodiment is configured of an IIU using an MCP as illustrated in the portions (a) and (b) of FIG. 13A and FIG. 13B.

[13.2 Operation]

Control performed by the controller 8A provided to the EUV light generation device 1 of the fourth embodiment will be described with reference to FIG. 14.

Figure 14:
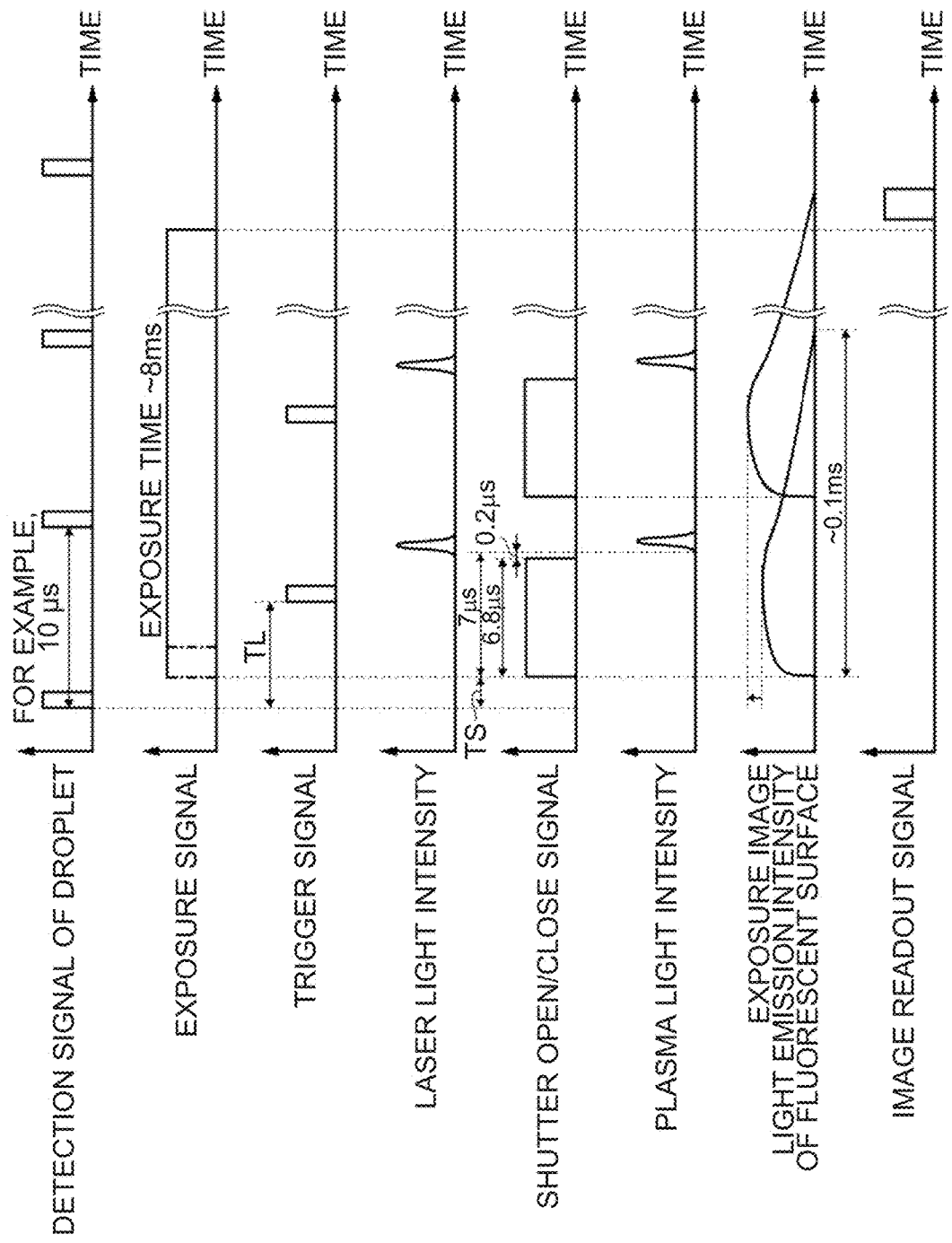
FIG. 14 is a time chart regarding acquisition of an image of a droplet in a controller of an EUV light generation device according to a fourth embodiment.

The EUV light generation device 1 of the fourth embodiment may perform control illustrated in the time chart of FIG. 14 instead of that illustrated in FIG. 7C, when the controller 8A of the EUV light generation device 1 of the first embodiment performs control illustrated in the time chart of FIG. 7C.

As illustrated in FIG. 14, the controller 8A may output a shutter open/close signal to the shutter device 422d based on the fact that a detection signal of the droplet 271 is input to the controller 8A. Thereby, the shutter provided to the shutter device 422d can be open. Then, an electron emitted from the MCP may collide with the fluorescent surface of the IIU, and light may be emitted.

The emission intensity on the fluorescent surface can keep increasing during when the shutter is open for 6.8 μs. Then, after the shutter is closed, the fluorescent surface can continue emission while lowering the emission intensity. The fluorescent surface can continue emission for about 0.1 ms from the start of the emission.

Accordingly, on the fluorescent surface, before emission for acquiring an optical image of the droplet 271 corresponding to a detection signal of the droplet 271 is finished, emission for acquiring an optical image of the droplet 271 corresponding to the subsequent detection signal can be made.

Therefore, the controller 8A may not output an exposure signal before outputting a shutter open/close signal to the shutter device 422d.

As such, in the fourth embodiment, the timing of outputting an exposure signal by the controller 8A may be the same as the timing of outputting a shutter open/close signal to the shutter device 422d or after the timing of outputting a shutter open/close signal, as illustrated in FIG. 14.

During the exposure time, images of the droplet 271 may be applied with multiple exposure. Therefore, a maximum value of the emission intensity of the fluorescent surface can increase each time the controller 8A receives a detection signal of the droplet 271.

[13.3 Effect]

In the EUV light generation device 1 of the fourth embodiment, it is not necessary that the controller 8A outputs an exposure signal before outputting a shutter open/close signal to the shutter device 422d.

Thereby, in the EUV light generation device 1 of the fourth embodiment, it is possible to improve the degree of freedom in designing the timing of outputting an exposure signal by the controller 8A. Consequently, in the EUV light generation device 1 of the fourth embodiment, trajectory control of the droplet 271 can be performed easily. Therefore, in the EUV light generation device 1 of the fourth embodiment, stability of the operation can be improved.

14. Hardware Environment of Each Controller

A person skilled in the art will understand that the subject described herein can be implemented by combining a general purpose computer or a programmable controller and a program module or a software application. In general, a program module includes a routine, a program, a component, a data structure, and the like capable to implementing the processes described in the present disclosure.

Figure 15:
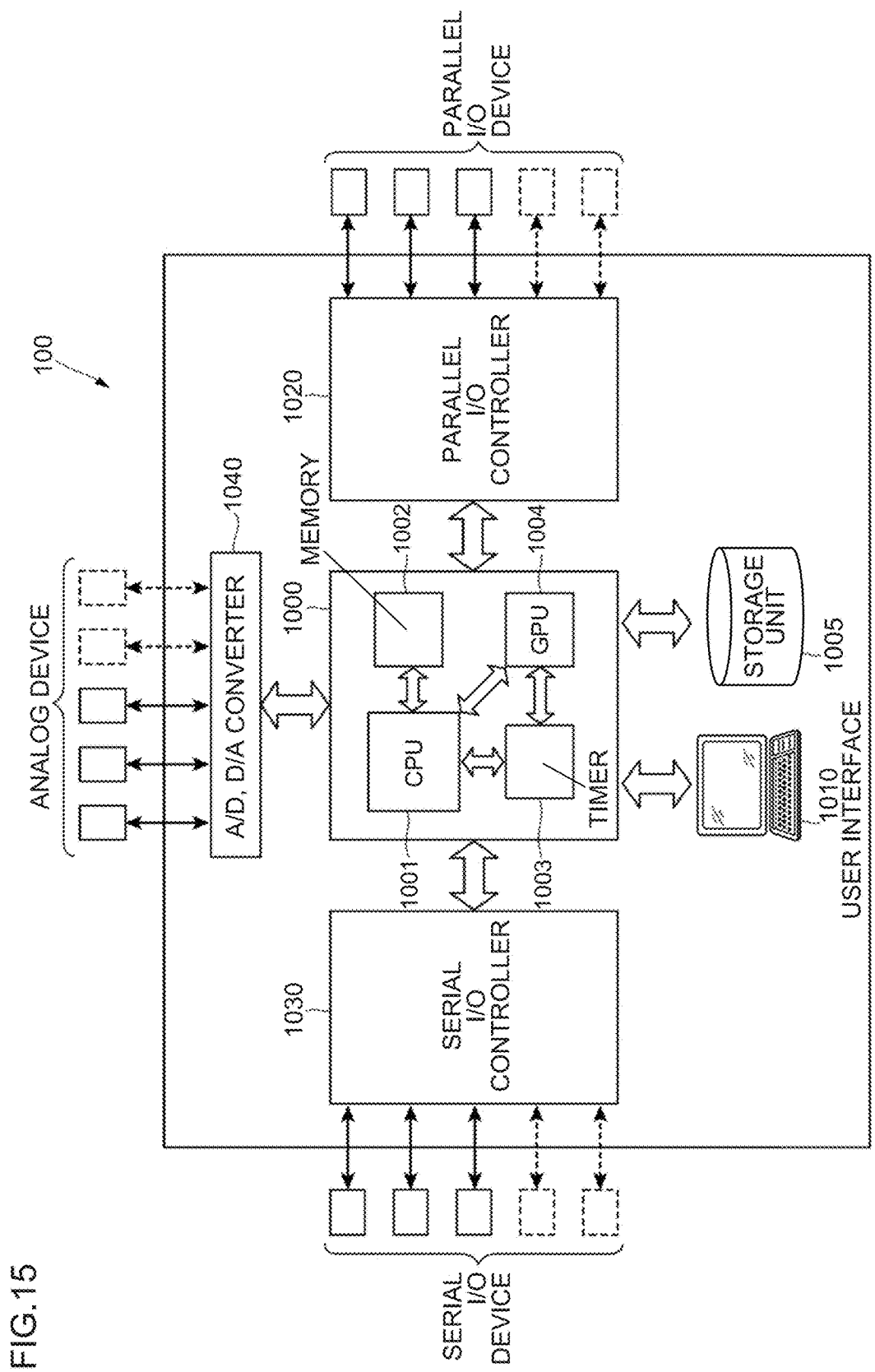
FIG. 15 is a block diagram illustrating a hardware environment of each controller.

FIG. 15 is a block diagram illustrating an exemplary hardware environment in which various aspects of the disclosed subject can be implemented. An exemplary hardware environment 100 in FIG. 15 may include a processing unit 1000, a storage unit 1005, a user interface 1010, a parallel I/O (input-output) controller 1020, a serial I/O controller 1030, and an A/D (analog to digital) and D/A (digital to analog) converter 1040. However, configuration of the hardware environment 100 is not limited to this.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially available processor. A dual microprocessor or another multiprocessor architecture may be used as the CPU 1001.

These constituent elements in FIG. 15 may be connected with each other to perform processes described in the present disclosure.

In the operation, the processing unit 1000 may read and execute a program stored in the storage unit 1005. The processing unit 1000 may also read data along with a program from the storage unit 1005. The processing unit 1000 may also write data to the storage unit 1005. The CPU 1001 may execute a program read from the storage unit 1005. The memory 1002 may be a work region for temporarily storing a program to be executed by the CPU 1001 and data used for operation of the CPU 1001. The timer 1003 may measure the time interval and output a measurement result to the CPU 1001 in accordance with execution of a program. The GPU 1004 may process image data according to a program read from the storage unit 1005, and output a processing result to the CPU 1001.

The parallel I/O controller 1020 may be connected with a parallel I/O device communicable with the processing unit 1000, such as the EUV light generation controller 5, the controller 8, the controller 8A to 8C, the laser light travel direction controller 34, or the like, and may control communications between the processing unit 1000 and such a parallel I/O device. The serial I/O controller 1030 may be connected with a serial I/O device communicable with the processing unit 1000, such as the light source 411a, the illumination light source 421a, the illumination light source 422j, the first illumination light-source unit 421P, the second illumination light-source unit 421Q, the illumination light-source unit 421R, the target stage 74, or the like, and may control communications with the processing unit 1000 and such a serial I/O device. The A/D and D/A converter 1040 may be connected with an analog device such as a temperature sensor, a pressure sensor, a vacuum gauge, various sensors, the target sensor 4, the light receiving element 412a, the image capturing element 422a, the first image capturing unit 422P, or the second image capturing unit 422Q, via an analog port, and may control communications between the processing unit 1000 and such an analog device, or perform A/D or D/A conversion of the communication content.

The user interface 1010 may display the progress of a program executed by the processing unit 1000 to the operator such that the operator can instruct the processing unit 1000 to stop the program or execute a cutoff routine.

The exemplary hardware environment 100 may be applied to the configurations of the EUV light generation controller 5, the controller 8, the controllers 8A to 8C, and the laser light travel direction controller 34 of the present disclosure. A person skilled in the art will understand that such controllers may be realized in a distributed computing environment, that is, an environment in which a task is executed by processing units connected over a communication network. In the present disclosure, the EUV light generation controller 5, the controller 8, the controllers 8A to 8C, and the laser light travel direction controller 34 may be connected with each other over a communication network such as Ethernet or the Internet. In a distributed computing environment, a program module may be stored in memory storage devices of both local and remote.

It will be obvious to those skilled in the art that the techniques of the embodiments described above are applicable to each other including the modifications.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to include". A term "have" should be construed as "not limited to that described to be held". Moreover, a modifier "a/an" described in the present description and in the scope of the accompanying claims should be construed to mean "at least one" or "one or more".

What is claimed is:

1. A target image-capture device configured to capture an image of a target, the target being made into plasma when irradiated with laser light and generating extreme-ultraviolet-light, the target image-capture device comprising:
   a droplet detector configured to detect passage of a droplet output, as the target, from a target supply unit to a predetermined region in which the extreme-ultraviolet-light is generated, and output a detection signal each time the passage of the droplet is detected;
   an illumination light source configured to radiate illumination light to the droplet detected by the droplet detector;
   an image capturing element configured to receive reflected light from the droplet, the reflected light being caused by the droplet being irradiated with the illumination light, and capture an image of the droplet;
   a shutter device including a shutter configured to switch between propagation and cutoff of light including the reflected light to the image capturing element; and
   a controller configured to output, to the image capturing element, an exposure signal allowing the image capturing element to perform image capturing, and output, to the shutter device, a shutter open/close signal allowing the shutter to perform an open and close operation upon input of the detection signal, to thereby allow the reflected light to be exposed to the image capturing element,
   the controller outputting the shutter open/close signal to the shutter device to make the shutter closed during when the droplet is irradiated with the laser light in the predetermined region so that the plasma is generated, wherein
   the controller controls the shutter device such that the shutter is opened and closed by the shutter open/close signal until a time when the droplet reaches the predetermined region after input of the detection signal,
   the controller outputs the exposure signal to the image capturing element after the detection signal is input and before the shutter open/close signal is output to the shutter device, and
   an image capturing region of the image capturing element includes the predetermined region in which the extreme-ultraviolet-light is generated.

2. A target image-capture device configured to capture an image of a target, the target being made into plasma when irradiated with laser light and generating extreme-ultraviolet-light, the target image-capture device comprising:
   a droplet detector configured to detect passage of a droplet output, as the target, from a target supply unit to a predetermined region in which the extreme-ultraviolet-light is generated, and output a detection signal each time the passage of the droplet is detected;

an illumination light source configured to radiate illumination light to the droplet detected by the droplet detector;

an image capturing element configured to receive reflected light from the droplet, the reflected light being caused by the droplet being irradiated with the illumination light, and capture an image of the droplet;

a shutter device including a shutter configured to switch between propagation and cutoff of light including the reflected light to the image capturing element; and a controller configured to output, to the image capturing element, an exposure signal allowing the image capturing element to perform image capturing, and output, to the shutter device, a shutter open/close signal allowing the shutter to perform an open and close operation upon input of the detection signal, to thereby allow the reflected light to be exposed to the image capturing element, the controller outputting the shutter open/close signal to the shutter device to make the shutter closed during when the droplet is irradiated with the laser light in the predetermined region so that the plasma is generated, wherein if a timing when the detection signal is input to the controller is defined as a first timing and a timing when the plasma is generated is defined as a second timing, the plasma being generated because the droplet, detected corresponding to the first timing, is irradiated with the laser light, the controller outputs the shutter open/close signal to the shutter device such that the shutter is opened after the first timing and the shutter is closed before the second timing, and the controller outputs the exposure signal to the image capturing element at a same timing as a timing of outputting the shutter open/close signal or at a timing after the timing of outputting the shutter open/close signal.

3. The target image-capture device according to claim 1, wherein the controller outputs the shutter open/close signal to the shutter device such that the shutter is open for a time within a range from 20% to 98% of a cycle of generating the plasma.

4. The target image-capture device according to claim 3, wherein the controller shutter open/close signal outputs the to the shutter device such that the shutter is open for a time within a range from 2 μs to 9.8 μs.

5. An extreme-ultraviolet-light generation device comprising:

a chamber in which a target supplied to a plasma generation region inside the chamber is made into plasma by being irradiated with laser light, and extreme-ultraviolet-light is generated;

a target supply unit configured to output the target as a droplet into the chamber to thereby supply the target to the plasma generation region;

a target stage configured to move the target supply unit to a direction substantially perpendicular to a trajectory of the droplet output from the target supply unit;

a droplet detector configured to detect passage of the droplet between the target supply unit and the plasma generation region, and output a detection signal each time the passage of the droplet is detected;

an illumination light source configured to radiate illumination light to the droplet detected by the droplet detector;

an image capturing element configured to receive reflected light from the droplet, the reflected light being caused by the droplet being irradiated with the illumination light, and capture an image of the droplet;

a shutter device including a shutter configured to switch between propagation and cutoff of light including the reflected light to the image capturing element; and a controller configured to output, to the image capturing element, an exposure signal allowing the image capturing element to perform image capturing, and output, to the shutter device, a shutter open/close signal allowing the shutter to perform an open and close operation upon input of the detection signal, to thereby allow the reflected light to be exposed to the image capturing element, the controller configured to control the target stage based on an image that is acquired by exposing the reflected light to the image capturing element and output from the image capturing element, the controller outputting the shutter open/close signal to the shutter device to make the shutter closed during when the droplet is irradiated with the laser light in the plasma generation region so that the plasma is generated.

6. The extreme-ultraviolet-light generation device according to claim 5, wherein the controller controls the shutter device such that the shutter is opened and closed by the shutter open/close signal until a time when the droplet reaches the plasma generation region after input of the detection signal.

7. The extreme-ultraviolet-light generation device according to claim 6, wherein the controller outputs the exposure signal to the image capturing element after the detection signal is input and before the shutter open/close signal is output to the shutter device.

8. The extreme-ultraviolet-light generation device according to claim 7, wherein an image capturing region of the image capturing element includes the plasma generation region in which the extreme-ultraviolet-light is generated.

9. The extreme-ultraviolet-light generation device according to claim 5, wherein if a timing when the detection signal is input to the controller is defined as a first timing and a timing when the plasma is generated is defined as a second timing, the plasma being generated because the droplet, detected corresponding to the first timing, is irradiated with the laser light, the controller outputs the shutter open/close signal to the shutter device such that the shutter is opened after the first timing and the shutter is closed before the second timing, and the controller outputs the exposure signal to the image capturing element at a same timing as a timing of outputting the shutter open/close signal or at a timing after the timing of outputting the shutter open/close signal.

10. The extreme-ultraviolet-light generation device according to claim 5, wherein the controller outputs the shutter open/close signal to the shutter device such that the shutter is open for a time within a range from 20% to 98% of a cycle of generating the plasma.

11. The extreme-ultraviolet-light generation device according to claim 10, wherein
the controller outputs the shutter open/close signal to the shutter device such that the shutter is open for a time within a range from 2 µs to 9.8 µs.

12. An extreme-ultraviolet-light generation system comprising:
a chamber in which a target supplied to a plasma generation region inside the chamber is made into plasma by being irradiated with laser light so that extreme-ultraviolet-light is generated;
a laser device configured to output the laser light;
a target supply unit configured to supply the target as a droplet to the plasma generation region;
a target stage configured to move the target supply unit to a direction substantially perpendicular to a trajectory of the droplet output from the target supply unit;
a droplet detector configured to detect passage of the droplet between the target supply unit and the plasma generation region, and output a detection signal each time the passage of the droplet is detected;
an illumination light source configured to radiate illumination light to the droplet detected by the droplet detector;
an image capturing element configured to receive reflected light from the droplet, the reflected light being caused by the droplet being irradiated with the illumination light, and capture an image of the droplet;
a shutter device including a shutter configured to switch between propagation and cutoff of light including the reflected light to the image capturing element; and
a controller configured to output a trigger signal allowing the laser device to output the laser light based on input of the detection signal, output, to the image capturing element, an exposure signal allowing the image capturing element to perform image capturing, and output, to the shutter device, a shutter open/close signal allowing the shutter to perform an open and close operation based on input of the trigger signal, to thereby allow the reflected light to be exposed to the image capturing element, and move the target stage based on an image that is acquired by exposing the reflected light to the image capturing element and output from the image capturing element,
the controller outputting the shutter open/close signal to the shutter device to make the shutter closed during when the droplet is irradiated with the laser light in the plasma generation region so that the plasma is generated.

13. The extreme-ultraviolet-light generation system according to claim 12, wherein
the controller controls the shutter device such that the shutter is opened and closed by the shutter open/close signal until a time when the droplet reaches the plasma generation region after input of the detection signal.

14. The extreme-ultraviolet-light generation system according to claim 13, wherein
the controller outputs the exposure signal to the image capturing element after the detection signal is input and before the shutter open/close signal is output to the shutter device.

15. The extreme-ultraviolet-light generation system according to claim 14, wherein
an image capturing region of the image capturing element includes the plasma generation region in which the extreme-ultraviolet-light is generated.

16. The extreme-ultraviolet-light generation system according to claim 12, wherein
if a timing when the detection signal is input to the controller is defined as a first timing and a timing when the plasma is generated is defined as a second timing, the plasma being generated because the droplet, detected corresponding to the first timing, is irradiated with the laser light,
the controller outputs the shutter open/close signal to the shutter device such that the shutter is opened after the first timing and the shutter is closed before the second timing, and
the controller outputs the exposure signal to the image capturing element at a same timing as a timing of outputting the shutter open/close signal or at a timing after the timing of outputting the shutter open/close signal.

17. The extreme-ultraviolet-light generation system according to claim 12, wherein
the controller outputs the shutter open/close signal to the shutter device such that the shutter is open for a time within a range from 20% to 98% of a cycle of generating the plasma.

18. The target image-capture device according to claim 2, wherein
the controller outputs the shutter open/close signal to the shutter device such that the shutter is open for a time within a range from 20% to 98% of a cycle of generating the plasma.

19. The target image-capture device according to claim 18, wherein
the controller shutter open/close signal outputs the to the shutter device such that the shutter is open for a time within a range from 2 µs to 9.8 µs.

* * * * *